(12) United States Patent
Lord et al.

(10) Patent No.: US 11,821,912 B2
(45) Date of Patent: Nov. 21, 2023

(54) METHODS OF PRODUCING AUGMENTED PROBE SYSTEM IMAGES AND ASSOCIATED PROBE SYSTEMS

(71) Applicant: FormFactor, Inc., Livermore, CA (US)

(72) Inventors: Anthony James Lord, Banbury (GB); Gavin Neil Fisher, Fenny Compton (GB); David Randle Hess, Beaverton, OR (US)

(73) Assignee: FormFactor, Inc., Livermore, CA (US)

( * ) Notice: Subject to any disclaimer, the term of this patent is extended or adjusted under 35 U.S.C. 154(b) by 428 days.

(21) Appl. No.: 17/313,789

(22) Filed: May 6, 2021

(65) Prior Publication Data
US 2021/0373073 A1    Dec. 2, 2021

Related U.S. Application Data

(60) Provisional application No. 63/032,310, filed on May 29, 2020.

(51) Int. Cl.
*G01R 31/311* (2006.01)
*G01R 31/319* (2006.01)

(52) U.S. Cl.
CPC ...... *G01R 31/311* (2013.01); *G01R 31/31917* (2013.01)

(58) Field of Classification Search
None
See application file for complete search history.

(56) References Cited

U.S. PATENT DOCUMENTS

| | | | |
|---|---|---|---|
| 2005/0015005 A1* | 1/2005 | Kockro | A61B 34/20 600/117 |
| 2006/0189867 A1 | 8/2006 | Revie et al. | |
| 2010/0039132 A1* | 2/2010 | Hertz | G01R 1/025 324/755.01 |
| 2017/0205443 A1* | 7/2017 | Bolt | G01R 1/06794 |
| 2018/0328890 A1* | 11/2018 | Lopez | G01N 29/0663 |
| 2019/0369141 A1 | 12/2019 | Beng et al. | |

FOREIGN PATENT DOCUMENTS

| | | | | |
|---|---|---|---|---|
| WO | WO2018/232404 | 12/2018 | | |
| WO | WO-2018232404 A1 * | 12/2018 | ............. | G01R 1/025 |

* cited by examiner

*Primary Examiner* — Uzma Alam
*Assistant Examiner* — Roberto Fabian, Jr.
(74) *Attorney, Agent, or Firm* — KOLITCH ROMANO DASCENZO GATES LLC

(57) ABSTRACT

Methods of producing augmented probe system images and associated probe systems. A method of producing an augmented probe system image includes recording a base probe system image, generating the augmented probe system image at least partially based on the base probe system image, and presenting the augmented probe system image. The augmented probe system image includes a representation of at least a portion of the probe system that is obscured in the base probe system image. In some examples, a probe system includes a chuck, a probe assembly, an imaging device, and a controller programmed to perform methods disclosed herein.

22 Claims, 6 Drawing Sheets

METHODS OF PRODUCING AUGMENTED PROBE SYSTEM IMAGES AND ASSOCIATED PROBE SYSTEMS

RELATED APPLICATION

This application claims priority to U.S. Provisional Patent Application No. 63/032,310, which is entitled METHODS OF PRODUCING AUGMENTED PROBE SYSTEM IMAGES AND ASSOCIATED PROBE SYSTEMS, was filed on May 29, 2020, and the complete disclosure of which is hereby incorporated by reference.

FIELD OF THE DISCLOSURE

The present disclosure relates generally to methods of producing augmented probe system images and associated probe systems.

BACKGROUND OF THE DISCLOSURE

Probe systems may be utilized to test the operation of a device under test (DUT). In specific examples, the DUT may include a semiconductor device, and the probe system may be configured to electrically test the operation of the DUT, such as by providing a test signal to the DUT and/or by receiving a resultant signal from the DUT.

In some configurations, the probe system utilizes an imaging device that produces a top-down view of a probe of the probe system relative to a corresponding DUT, such as to facilitate aligning the probe with the DUT for proper electrical communication between the probe and the DUT. In some such examples, the imaging device is positioned relative to the probe such that a probe tip of the probe that forms electrical contact with the DUT is optically obstructed by another portion of the probe and/or such that a region of the DUT is optically obstructed by the probe, rendering it difficult to precisely position the probe tip relative to the DUT. Thus, there exists a need for methods of producing augmented probe system images, and for associated probe systems.

SUMMARY OF THE DISCLOSURE

Methods of producing augmented probe system images and associated probe systems are disclosed herein. A method of producing an augmented probe system image representing a portion of a probe system includes recording, with an imaging device, a base probe system image of at least a portion of the probe system and generating, with a controller, the augmented probe system image. The generating the augmented probe system image is based, at least in part, on the base probe system image. A method of producing the augmented probe system image further includes presenting the augmented probe system image with a display. The augmented probe system image includes a representation of at least a portion of the probe system that is obscured by another portion of the probe system in the base probe system image.

In some examples, a probe system includes a chuck with a chuck support surface configured to support a substrate that includes one or more DUTs and a probe assembly with a probe configured to test a corresponding DUT of the one or more DUTs. The probe system additionally includes an imaging device configured to receive an optical image of at least a portion of the probe system and a controller programmed to perform the methods disclosed herein to generate the augmented probe system image.

DETAILED DESCRIPTION AND BEST MODE OF THE DISCLOSURE

Figure 1:
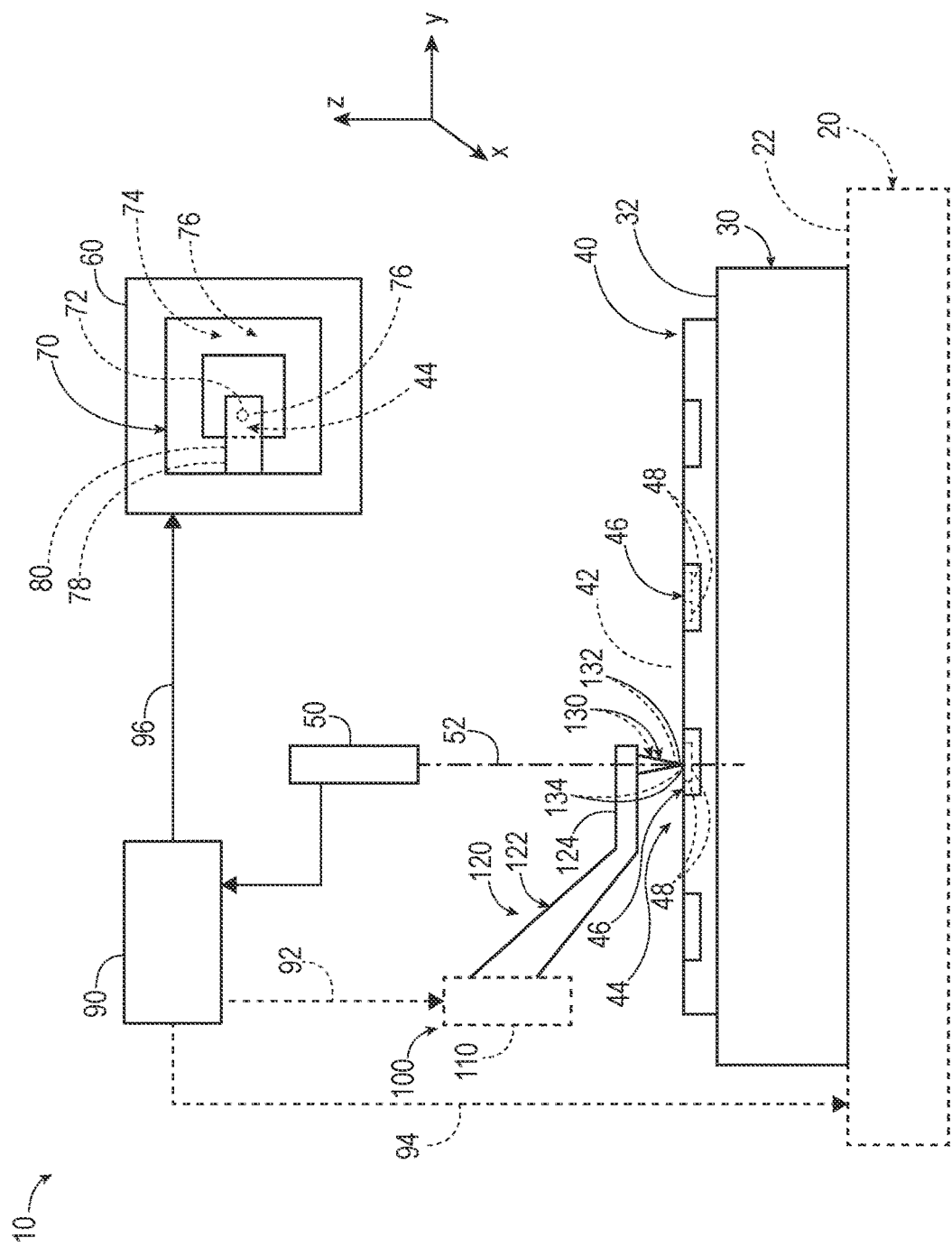
FIG. 1 is a schematic side elevation view representing examples of probe systems according to the present disclosure.

FIGS. 1-7 provide examples of probe assemblies 100, of probe systems 10 that include probe assemblies 100 and/or substrates 40, of images of probe assemblies 100 and/or of substrates 40, and/or of methods 200 of producing an augmented probe system image 70, according to the present disclosure. Elements that serve a similar, or at least substantially similar, purpose are labeled with like numbers in FIGS. 1-7, and these elements may not be discussed in detail herein with reference to each of FIGS. 1-7. Similarly, all elements may not be labeled in FIGS. 1-7, but reference numbers associated therewith may be utilized herein for consistency. Elements, components, and/or features that are discussed herein with reference to FIGS. 1-7 may be included in and/or utilized with the subject matter of FIGS. 1-7 without departing from the scope of the present disclosure. In general, elements that are likely to be included in a particular embodiment are illustrated in solid lines, while elements that are optional are illustrated in dashed (e.g., broken) lines. However, elements that are shown in solid lines may not be essential and, in some embodiments, may be omitted without departing from the scope of the present disclosure.

As schematically illustrated in FIG. 1, probe system 10 according to the present disclosure may be adapted, configured, designed, shaped, sized, and/or constructed to test one or more devices under test (DUTs) 46, which may be formed on, supported by, and/or included in a substrate 40. Specifically, and as schematically illustrated in FIG. 1, probe system 10 includes a chuck 30 with a chuck support surface 32 configured to support a substrate 40 that includes one or more DUTs 46. Probe system 10 additionally includes a probe assembly 100 that includes at least one probe 120 configured to test a corresponding DUT 46. As additionally schematically illustrated in FIG. 1, probe system 10 further includes an imaging device 50 that is configured to generate an optical image of at least a portion of probe system 10, as well as a controller 90 that is programmed to generate an augmented probe system image 70, as described herein.

In some examples, and as further schematically illustrated in FIG. 1, probe system 10 includes a display 60 that is configured to present (e.g., show, illustrate, and/or display)

augmented probe system image 70. Specifically, and as described in more detail herein, FIG. 1 schematically illustrates display 60 as presenting augmented probe system image 70 that may include a virtual probe tip marker 72 and/or that may depict and/or illustrate a covered region 44 of substrate 40. Additionally, and as described in more detail herein, FIG. 1 schematically illustrates augmented probe system image 70 as including and/or at least partially representing a real-time substrate image 74, a reference substrate image 76, a real-time probe image 78, and/or a reference probe representation 80.

Figure 5:
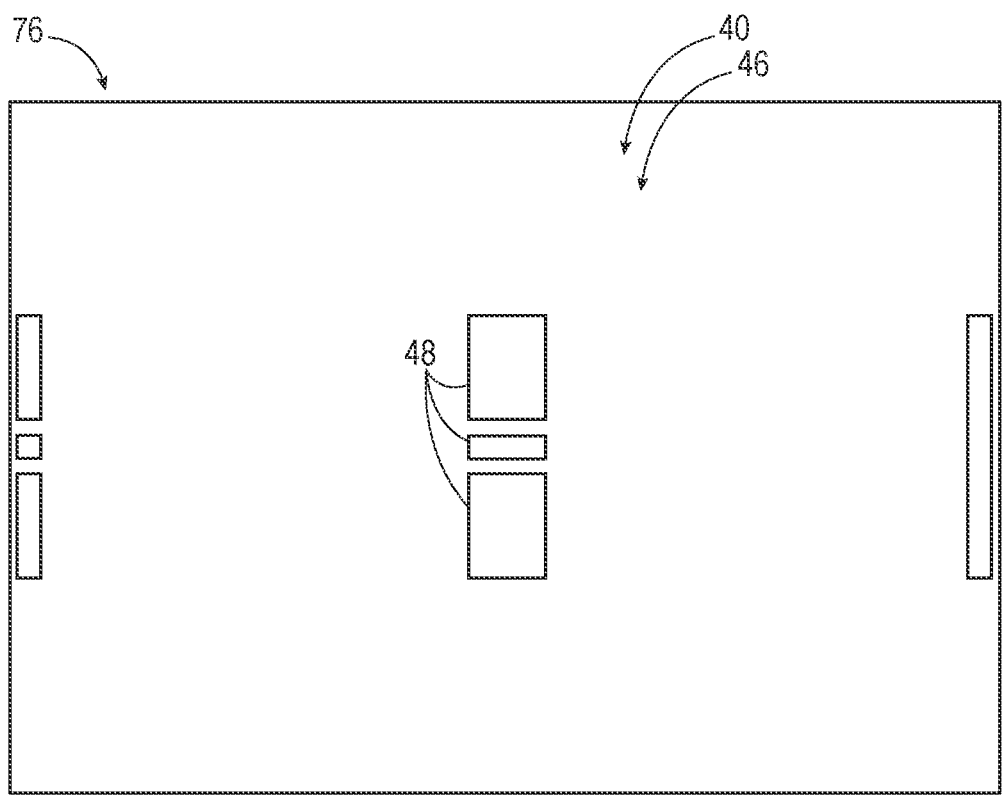
FIG. 5 is a representation of examples of reference substrate images according to the present disclosure.
Figure 6:
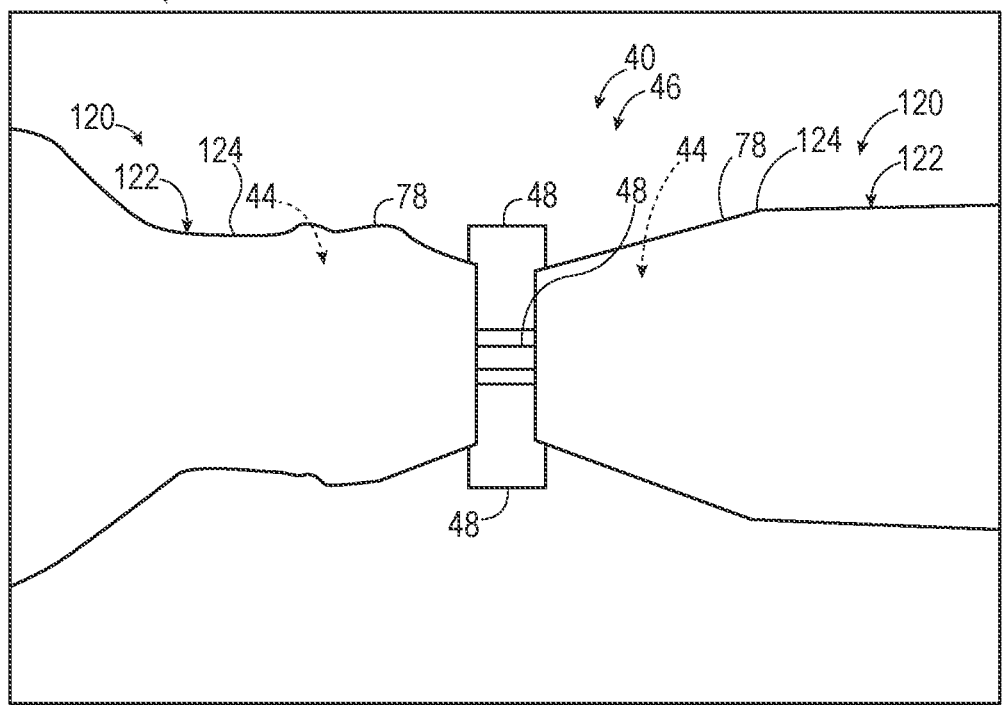
FIG. 6 is a representation of examples of base probe system images according to the present disclosure.
Figure 7:
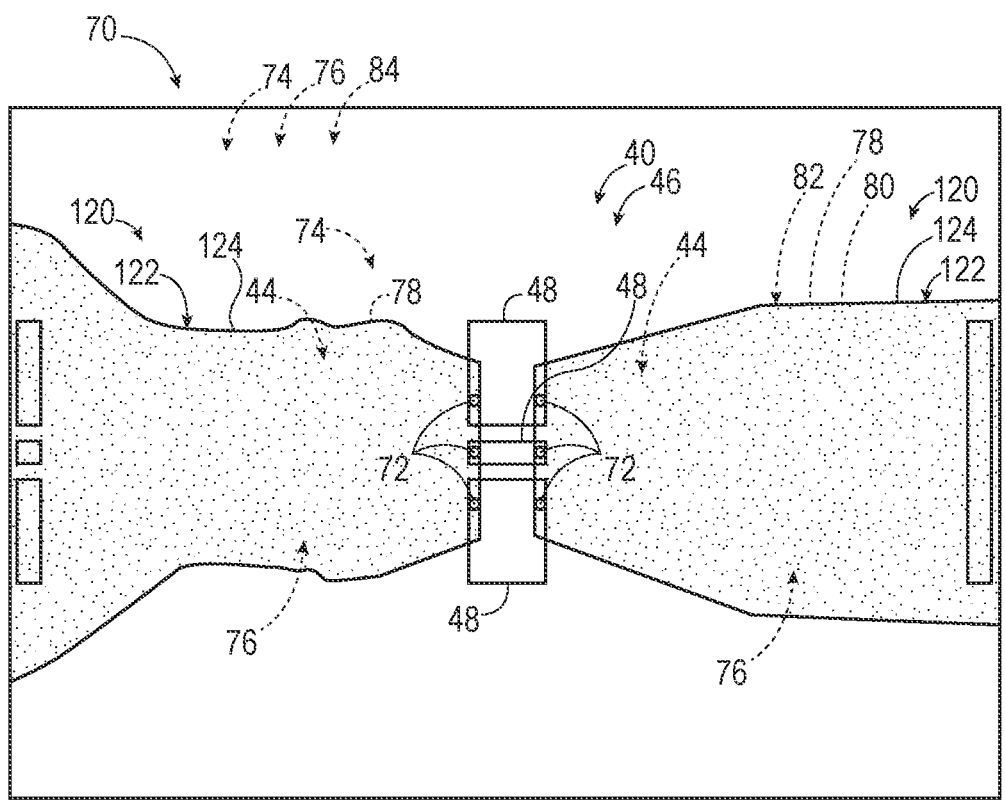
FIG. 7 is a representation of examples of augmented probe system images according to the present disclosure.

In particular, and as described in more detail herein, imaging device 50 may be positioned and/or oriented relative to probe assembly 100 and/or substrate 40 such that probe 120 at least partially conceals a portion of substrate 40 and/or of probe 120 itself from being directly imaged by imaging device 50. This visual obstruction thus may introduce a difficulty, for example, when the optical image generated by imaging device 50 is utilized to assist in aligning probe 120 with the corresponding DUT 46 and/or with a contact pad thereof. As a more specific example, and as discussed in more detail herein, FIG. 5 illustrates an example of an optical image generated by imaging device 50 depicting a region of substrate 40 with a plurality of contact pads 48 of DUT 46. FIG. 6 illustrates an example in which a pair of probes 120 have been introduced into the field of view of imaging device 50, thus optically concealing covered regions 44 of substrate 40 that contain portions of contact pads 48. In order to facilitate alignment of the probe tips of each probe 120 with corresponding contact pads 48, the systems and methods disclosed herein correspond to systems and methods for producing augmented probe system image 70, examples of which are depicted in FIG. 7. In particular, and as described in more detail herein, FIG. 7 represents examples of augmented probe system image 70 in which the location of each probe tip is represented via a respective virtual probe tip marker 72 and/or in which covered region 44 of substrate 40 is graphically represented, such as to graphically represent the locations of contact pads 48 that extend within covered region 44.

In some examples, and as schematically illustrated in FIG. 1, controller 90 is programmed to generate and transmit an augmented probe system image signal 96 to display 60. In particular, in such examples, augmented probe system image signal 96 includes, or is, any suitable electronic signal that is received and processed by display 60 to present a graphical representation of augmented probe system image 70.

Controller 90 may include and/or be any suitable structure, device, and/or devices that may be adapted, configured, designed, constructed, and/or programmed to perform the functions discussed herein. As examples, controller 90 may include one or more of an electronic controller, a dedicated controller, a special-purpose controller, a personal computer, a special-purpose computer, a display device, a logic device, a memory device, and/or a memory device having computer-readable storage media.

The computer-readable storage media, when present, also may be referred to herein as non-transitory computer readable storage media. This non-transitory computer readable storage media may include, define, house, and/or store computer-executable instructions, programs, and/or code; and these computer-executable instructions may direct probe system 10 and/or controller 90 thereof to perform any suitable portion, or subset, of methods 200. Examples of such non-transitory computer-readable storage media include CD-ROMs, disks, hard drives, flash memory, etc. As used herein, storage, or memory, devices and/or media having computer-executable instructions, as well as computer-implemented methods and other methods according to the present disclosure, are considered to be within the scope of subject matter deemed patentable in accordance with Section 101 of Title 35 of the United States Code.

Substrate 40 may include and/or be any suitable structure that may support, include, and/or have formed thereon DUT(s) 46. Examples of substrate 40 include a wafer, a semiconductor wafer, a silicon wafer, a gallium nitride wafer, and/or a gallium arsenide wafer. Similarly, DUT(s) 46 may include and/or be any suitable structure that may be probed and/or tested by probe system 10. As examples, DUT(s) 46 may include a semiconductor device, an electronic device, an optical device, an optoelectronic device, a logic device, a power device, a switching device, and/or a transistor. In some examples, probe system 10 may be described as including substrate 40.

Probe 120 may have any appropriate form and/or structure for testing DUT 46. For example, and as schematically illustrated in FIG. 1, probe 120 may include a probe body 122 and a probe tip 130 extending from probe body 122 for establishing electrical and/or optical contact and/or communication with DUT 46. Probe 120 may include any appropriate number of probe tips 130, such as one probe tip, two probe tips, three probe tips, or more than three probe tips. In some examples, and as schematically illustrated in FIG. 1, probe body 122 includes a probe beam 124 such that each probe tip 130 extends from probe beam 124. In an example in which probe system 10 includes a plurality of probes 120 with a corresponding plurality of probe beams 124, each probe tip 130 may be described as extending from a corresponding probe beam 124 of the plurality of probe beams.

In some examples, and as schematically illustrated in FIG. 1, probe tip 130 terminates in a probe tip end 132 for contacting DUT 46 during operative use of probe system 10. In some such examples, and as further schematically illustrated in FIG. 1, DUT 46 includes one or more contact pads 48 such that probe tip 130 is configured to contact a corresponding contact pad of the one or more contact pads during testing of DUT 46. While the examples illustrated and described herein generally pertain to examples in which probe tip 130 is configured to directly contact DUT 46 and/or contact pad 48, this is not required, and it is additionally within the scope of the present disclosure that probe tip 130 may be configured for non-contact, optical, and/or electromagnetic testing of DUT 46. As an example, probe tip 130 may include and/or be an optical fiber, and DUT 46 may include an optical coupler that is configured to receive a light signal from, and/or to transmit a light signal to, the optical fiber.

During operative use of probe system 10 to test one or more DUTs 46, it may be desirable to identify and/or visualize a location of probe 120 (and/or probe tip 130 thereof) relative to DUT 46 (and/or contact pad 48 thereof), such as to establish and/or maintain alignment between probe tip 130 and DUT 46 for testing of DUT 46 by probe system 10.

Accordingly, in some examples, imaging device 50 is configured to generate an optical image of at least a portion of probe 120 and/or at least a portion of substrate 40. More specifically, and as schematically illustrated in FIG. 1, imaging device 50 may be configured to receive light rays along an optical axis 52, such as may extend at least substantially perpendicular to chuck support surface 32 and/or to a plane of substrate 40. In particular, in such examples, imaging device 50 may be configured to receive light rays that are reflected from and/or emitted by probe system 10 and/or substrate 40 along a direction at least substantially parallel to optical axis 52, such that the optical image that is generated by the imaging device is a representation of the light rays received by the imaging device.

In some examples, and as schematically illustrated in FIG. 1, imaging device 50 is positioned such that probe 120 is located between imaging device 50 and chuck 30 along optical axis 52. Accordingly, in such examples, imaging device 50 faces substrate 40 and is positioned on the same side of substrate 40 as probe 120 during operative use of probe system 10. Stated differently, in such examples, imaging device 50 is positioned such that probe 120 is proximal substrate 40 relative to imaging device 50. That is, in such examples, a distance separating probe 120 and substrate 40 is less than a distance separating imaging device 50 and substrate 40. In this manner, in the example schematically illustrated in FIG. 1, imaging device 50 may be described as generating an optical image that represents a top view of probe 120 and/or of substrate 40. As described herein, probe system 10 and methods 200 pertain to examples in which imaging device 50 is the sole imaging device of probe system 10. However, this is not required, and it is additionally within the scope of the present disclosure that probe system 10 may utilize a plurality of imaging devices 50 in conjunction with methods 200. In such examples, however, each imaging device 50 generally is positioned relative to probe 120 and substrate 40 such that probe 120 is positioned between substrate 40 and each imaging device 50 in the manner described herein and schematically illustrated in FIG. 1.

As used herein, positional terms such as "top," "above," "bottom," "below," and the like generally refer to a configuration in which substrate 40 rests upon chuck support surface 32 such that a plane of chuck support surface 32 and/or of substrate 40 is at least substantially horizontal (i.e., oriented perpendicular to a force of gravity). In this manner, in the examples described herein and as schematically illustrated in FIG. 1, probe 120 may be described as being positioned above, or vertically above, substrate 40, and/or chuck 30 may be described as being below, or vertically below, substrate 40. However, this is not required, and it is additionally within the scope of the present disclosure that probe system 10 and/or substrate 40 may have any appropriate orientation relative to one another and/or relative to a force of gravity during operative use of probe system 10 and/or during execution of methods 200 according to the present disclosure.

Imaging device 50 may include and/or be any appropriate device for receiving an optical image as described herein, such as via collection of light and/or electromagnetic radiation reflected and/or emitted by probe system 10 and/or substrate 40. That is, imaging device 50 may include and/or be any suitable structure that may be adapted, configured, designed, and/or constructed to receive and/or generate one or more optical images of probe system 10 and/or of substrate 40. As examples, imaging device 50 may include and/or be a microscope, a camera, a charge-coupled device, an imaging sensor, a solid-state imaging device, a C-MOS imaging device, and/or a lens. While FIG. 1 schematically illustrates imaging device 50 as being structurally separated from probe assembly 100, this is not required of all examples of probe system 10. For example, it additionally is within the scope of the present disclosure that imaging device 50 may be operatively and/or directly coupled to and/or supported by probe assembly 100. As a more specific example, imaging device 50 may be operatively coupled to and/or supported by probe body 122 of probe 120 in such a manner that probe body 122 extends between imaging device 50 and substrate 40.

As schematically illustrated in FIG. 1, imaging device 50 may be positioned relative to probe 120 and substrate 40 such that at least a portion of probe tip 130 and/or of substrate 40 is optically concealed and/or obstructed by at least a portion of probe 120. For example, at least a portion of probe body 122 and/or of probe beam 124 may be optically opaque, such that probe body 122 and/or probe beam 124 restricts imaging device 50 from receiving light rays from probe tip 130 and/or from a portion of substrate 40 that is positioned under probe body 122. Accordingly, in such examples, probe body 122 and/or probe beam 124 may restrict imaging device 50 from generating an image that illustrates and/or represents probe tip 130 and/or the portion of substrate 40 that is positioned under probe body 122. Thus, in an example in which a user utilizes an image of a portion of probe system 10 and/or of substrate 40 as generated by imaging device 50 to facilitate aligning probe 120 with DUT 46, the user may experience difficulty resulting from the fact that probe tip 130, and/or a portion of substrate 40 to be contacted by probe tip 130, is hidden from view. Accordingly, and as discussed in more detail herein, probe system 10 and methods 200 according to the present disclosure may be configured to enable and/or facilitate generation of augmented probe system image 70 that is at least partially generated by imaging device 50 and that illustrates a portion of probe system 10 and/or substrate 40 that is not directly visible to imaging device 50.

As discussed in more detail herein with reference to FIGS. 2-7, augmented probe system image 70 generally provides information regarding probe system 10 and/or substrate 40 that is not available in a real-time (e.g., live) image produced by imaging device 50 as shown in FIG. 1. However, and as described in more detail herein, probe system 10 still may be configured to generate augmented probe system image 70 with a single imaging device 50, and/or based solely on top view images of probe system 10.

As used herein, terms such as "live" and "real-time" are intended to refer to an image and/or representation that is generated and/or updated with sufficient frequency that the image and/or representation may be regarded as representing the configuration of the probe system at, or nearly at, the moment in time that the image is generated, presented, and/or viewed. As used herein, the term "top view," as used to describe a perspective from which one or more components of probe system 10 and/or of substrate 40 are viewed, is intended to refer to a view along a direction at least substantially parallel to optical axis 52 from a position that is located above at least a portion of probe 120, such as above probe body 122 and/or probe beam 124.

Figure 3:
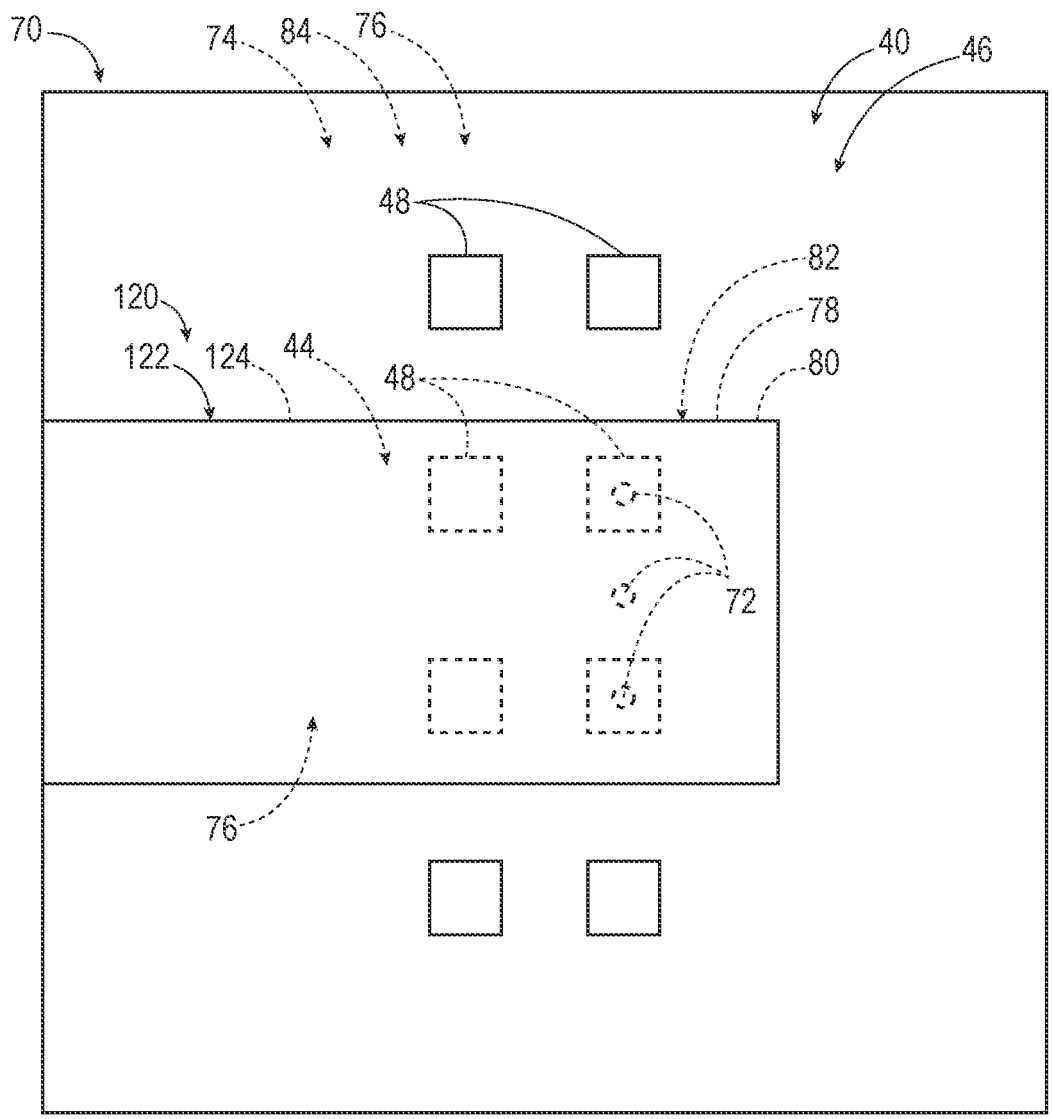
FIG. 3 is a schematic representation of examples of augmented probe system images according to the present disclosure.

In some examples, and as schematically illustrated in FIG. 3, augmented probe system image 70 may be generated to include one or more virtual probe tip markers 72 that represent the location(s) of one or more corresponding hidden probe tips 130. In some such examples, virtual probe tip marker(s) 72 may be generated by measuring and/or determining the location of each probe tip 130 relative to probe body 122. More specifically, in some examples, and as described in more detail herein, generating augmented probe system image 70 may include physically marking substrate 40 with probe tip 130 and subsequently moving probe body 122 relative to substrate 40 to reveal the mark on substrate 40 produced by probe tip 130. In this manner, comparing the locations of the mark on substrate 40 and of probe body 122 before and after moving probe body 122 relative to substrate 40 thus enables a determination of the location of probe tip 130 relative to probe body 122 from the perspective of imaging device 50. Accordingly, in such examples, probe system 10 and/or controller 90 may generate augmented probe system image 70 such that each virtual probe tip marker 72 is positioned relative to the corresponding probe body 122 at a location overlying the measured location of the corresponding probe tip 130 relative to the corresponding probe body 122. Stated differently, in such examples, each virtual probe tip marker 72 may be generated to appear at a location relative to a graphical representation of the corresponding probe body 122 that corresponds to, or is the same as, the measured location of the corresponding probe tip 130 relative to the corresponding probe body 122.

In other examples, the location of probe tip 130 relative to a portion of probe body 122 as viewed by imaging device 50 may be known and/or determined, such as by a measurement or configuration that is made prior to generating augmented probe system image 70. In such examples, probe system 10 and/or controller 90 may generate augmented probe system image 70 such that each virtual probe tip marker 72 is positioned relative to the corresponding probe body 122 at a location overlying the previously-known location of the corresponding probe tip 130 relative to the corresponding probe body 122. Stated differently, in such examples, each virtual probe tip marker 72 may be generated to appear at a location relative to a graphical representation of the corresponding probe body 122 that corresponds to, or is the same as, the previously known location of the corresponding probe tip 130 relative to the corresponding probe body 122.

In other examples, and as schematically illustrated in FIG. 3, augmented probe system image 70 may be generated to include a visualization of a portion of substrate 40 that is otherwise hidden by probe body 122. As more specific examples, generating augmented probe system image 70 may include simulating and/or representing probe body 122 as being at least partially transparent, and/or by superimposing a representation of one or more structures of substrate 40 on and/or over a representation of probe body 122. More specifically, in such examples, and as described in more detail herein, generating augmented probe system image 70 may include recording reference substrate image 76 representing a portion and/or region of substrate 40 when the portion and/or region is not concealed by probe body 122 and subsequently combining reference substrate image 76 with a real-time (e.g., live) image that includes probe body 122 and/or within which probe body 122 conceals the portion and/or region of substrate 40.

In such examples, augmented probe system image 70 may visually represent the region of substrate 40 that is covered and/or concealed by probe body 122 as a corresponding region of substrate 40 as recorded in reference substrate image 76. As examples, the region of substrate 40 that is covered and/or concealed by probe body 122 may be represented as an optical image of the corresponding region of substrate 40 as recorded in reference substrate image 76, and/or may be represented as a synthesized and/or modified representation of the corresponding region of substrate 40 as recorded in reference substrate image 76. As a more specific example, the region of substrate 40 that is covered and/or concealed by probe body 122 may be represented in augmented probe system image 70 as a simplified graphical representation of the corresponding region of substrate 40, such as an outline of the corresponding region of the substrate and/or of one or more structures contained within the corresponding region of the substrate.

As discussed in more detail herein, FIG. 5 illustrates an example of reference substrate image 76, while FIG. 6 illustrates an example of a live image (e.g., an image including real-time substrate image 74 and/or real-time probe image 78) that may be produced by imaging device 50, and FIG. 7 illustrates an example of augmented probe system image 70 formed by combining the images of FIGS. 5-6 as described herein. FIG. 7 additionally illustrates an example in which augmented probe system image 70 includes a plurality of virtual probe tip markers 72 representing the locations of probe tips that are obscured from view by probe beam 124.

Probe system 10 may be configured to establish alignment between probe 120 and DUT 46 in any appropriate manner. For example, and as schematically illustrated in FIG. 1, probe assembly 100 may include a probe manipulator 110 that operatively supports probe 120 and that is configured to operatively translate and/or rotate probe 120 relative to chuck 30 and/or relative to substrate 40. Probe manipulator 110 may be configured to move probe 120 in any appropriate manner, such as by selectively translating and/or selectively rotating probe 120 relative to chuck 30 and/or relative to substrate 40. In this manner, probe manipulator 110 may be utilized to operatively translate probe 120 throughout a probe range-of-motion, thereby operatively translating probe 120 relative to DUT 46 and/or aligning probe 120 with DUT 46.

As an example, probe manipulator 110 may be utilized to operatively align probe 120 with specific, target, and/or desired locations on DUT 46 (e.g., contact pads 48 thereof), such as to permit communication between the corresponding probes and the DUT. This may include operative translation and/or rotation of probe 120 in and/or about a plurality of different, separate, distinct, perpendicular, and/or orthogonal directions, such as the X-, Y-, and/or Z-directions that are illustrated in FIG. 1. In the example of FIG. 1, the X- and Y-directions may be parallel, or at least substantially parallel, to substrate 40 (e.g., to a plane defined by substrate 40), while the Z-direction may be perpendicular, or at least substantially perpendicular, to substrate 40. However, this specific configuration is not required. For example, it additionally is within the scope of the present disclosure that the Z-direction may be parallel, or at least substantially parallel, to substrate 40 (e.g., to a plane defined by substrate 40), and/or that the X- or Y-direction may be perpendicular, or at least substantially perpendicular, to substrate 40.

Probe manipulator 110 may include and/or be any suitable structure that may be operatively attached to probe 120, and/or that may be configured to operatively translate and/or rotate probe 120 throughout the probe range-of-motion, such as may extend in three orthogonal, or at least substantially orthogonal, axes, such as the X-, Y-, and Z-axes of FIG. 1. As examples, probe manipulator 110 may include one or more translation stages, lead screws, ball screws, rack and pinion assemblies, motors, stepper motors, electrical actuators, mechanical actuators, piezoelectric actuators, micrometers, and/or manual actuators.

In some examples, probe manipulator 110 is configured to be controlled by controller 90. More specifically, in some such examples, and as schematically illustrated in FIG. 1, controller 90 is programmed to generate and transmit a probe manipulator control signal 92 to probe manipulator 110 to command the probe manipulator to translate and/or rotate probe 120.

Additionally or alternatively, and as schematically illustrated in FIG. 1, probe system 10 may include a chuck translation stage 20, which may include a chuck translation stage support surface 22 that operatively supports chuck 30. In such examples, chuck translation stage 20 may be configured to operatively translate and/or rotate chuck 30 relative to probe assembly 100 and/or relative to probe 120, such as to facilitate alignment between probe 120 and one or more DUT(s) 46 and/or to permit and/or facilitate sequential testing of a plurality of DUTs by probe assembly 100.

In some such examples, chuck translation stage 20 may be configured to translate chuck 30 and/or substrate 40 relative to probe 120 along a first axis and along a second axis that is perpendicular, or at least substantially perpendicular, to the first axis. The first axis and the second axis may both be parallel, or at least substantially parallel, to chuck translation stage support surface 22. For example, the first axis may be oriented in the X-direction as illustrated in FIG. 1, and/or the second axis may be oriented in the Y-direction as illustrated in FIG. 1. Chuck translation stage 20 additionally or alternatively may be configured to operatively and/or simultaneously translate chuck 30 and/or substrate 40 relative to probe 120 along a third axis that is perpendicular, or at least substantially perpendicular, to chuck translation stage support surface 22. For example, the third axis may be oriented in the Z-direction as illustrated in FIG. 1. Additionally or alternatively, chuck translation stage 20 may be configured to operatively and/or simultaneously rotate chuck 30 and/or substrate 40 about a rotation axis. The rotation axis may be perpendicular, or at least substantially perpendicular, to chuck translation stage support surface 22, and/or may be the third axis.

In some examples, chuck translation stage 20 is configured to be controlled by controller 90. More specifically, in some such examples, and as schematically illustrated in FIG. 1, controller 90 is programmed to generate and transmit a chuck translation stage control signal 94 to chuck translation stage 20 to command the chuck translation stage to translate and/or rotate chuck 30 and/or substrate 40.

Figure 2:
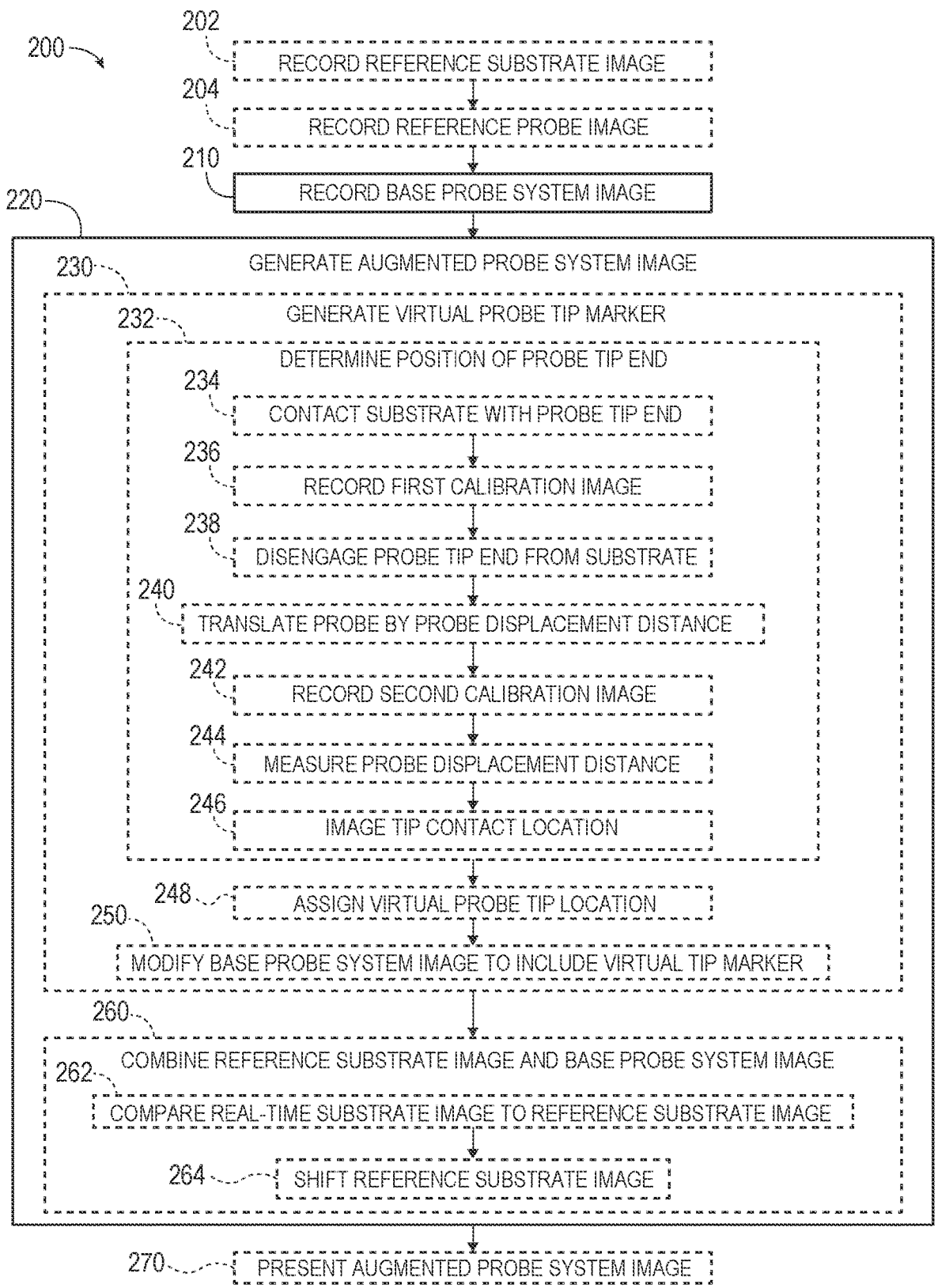
FIG. 2 is a flowchart depicting methods of producing an augmented probe system image according to the present disclosure.

FIG. 2 is a flowchart depicting examples of methods 200, according to the present disclosure, of producing an augmented probe system image that represents a portion of a probe system, while FIGS. 3-7 represent examples of images that may be produced and/or utilized via methods 200. Examples of probe systems that may be utilized in conjunction with methods 200 are disclosed herein with reference to probe system 10 of FIG. 1.

Figure 4:
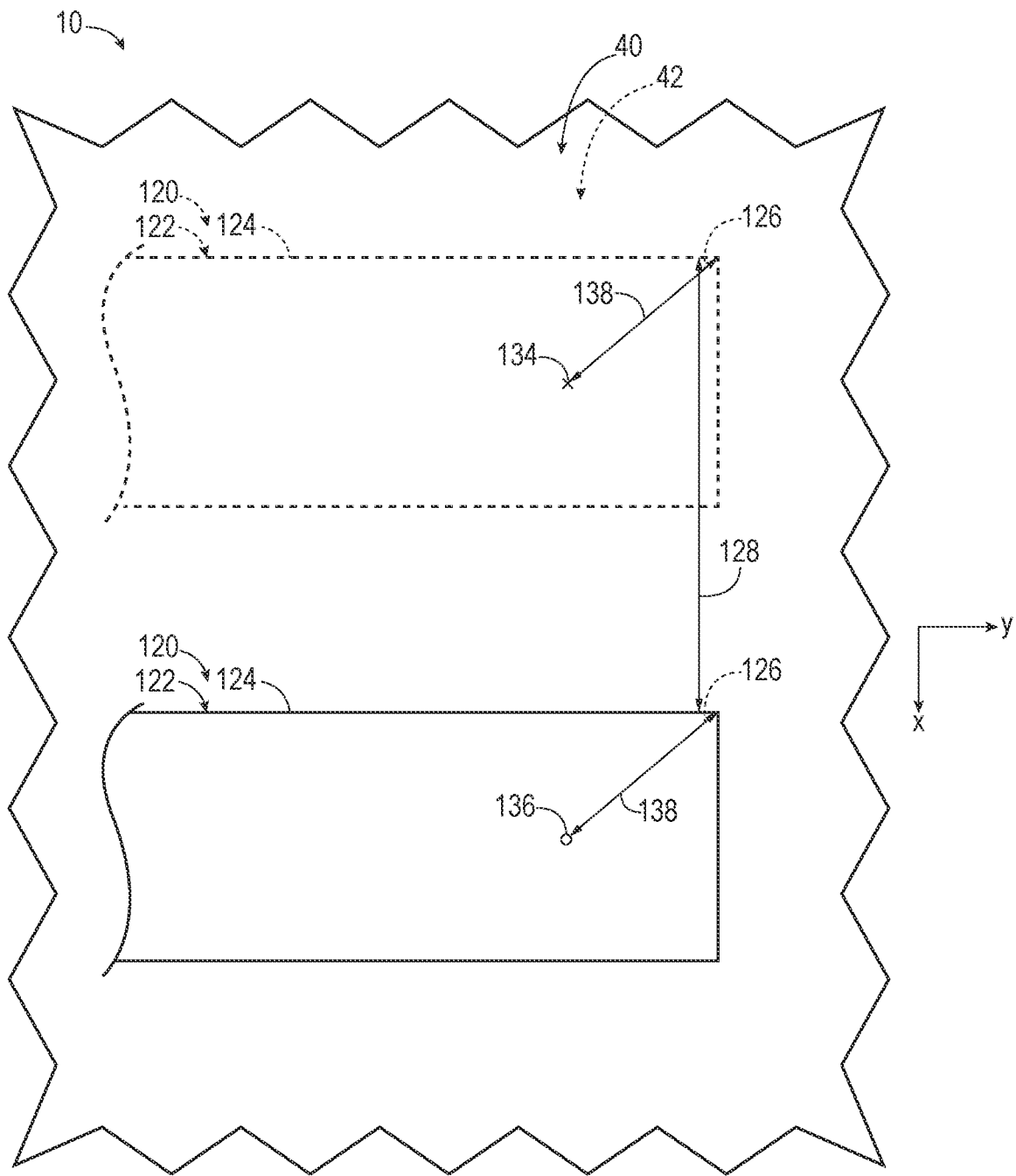
FIG. 4 is a schematic representation of an example of a portion of a method according to the present disclosure.

As discussed in more detail herein, FIG. 3 is a schematic illustration of examples of augmented probe system image 70 during operative use thereof. Specifically, FIG. 3 schematically illustrates examples of augmented probe system images 70 that depict a configuration in which probe body 122 (and/or probe beam 124 thereof) is positioned over substrate 40 such that probe body 122 covers a covered region 44 of substrate 40 that includes one or more contact pads 48 of DUT 46. As discussed in more detail herein, FIG. 4 is a schematic representation of components of probe system 10, of substrate 40, and/or of images thereof, that are associated with one or more steps of method 200.

FIGS. 5-7 are less schematic illustrations of examples of probe system 10 and/or of substrate 40 depicting aspects of methods 200. Specifically, and as discussed in more detail herein, FIG. 5 illustrates an example of reference substrate image 76, such as may be recorded and/or produced by imaging device 50, which shows a plurality of contact pads 48 of DUT 46 on substrate 40. As discussed in more detail herein, FIG. 6 illustrates an example of base probe system image 54, such as may be recorded and/or produced by imaging device 50, that shows substrate 40 of FIG. 5 as well as two probes 120 that are introduced into the field of view of imaging device 50 such that probe beam 124 of each probe 120 covers a respective covered region 44 of substrate 40 and/or such that each covered region 44 is not visible in base probe system image 54. As discussed in more detail herein, FIG. 7 illustrates an example of augmented probe system image 70, such as may be produced by controller 90 at least partially based upon reference substrate image 76 of FIG. 5 and/or base probe system image 54 of FIG. 6. Specifically, FIG. 7 illustrates an example in which each covered region 44 of substrate 40 (as indicated in FIG. 6) is depicted and/or illustrated in augmented probe system image 70, and in which augmented probe system image 70 further includes a plurality of virtual probe tip markers 72 that represent the locations of corresponding probe tips 130 (which are labelled but not visible in FIG. 6; see, for example, probe tip 130 of FIG. 1) relative to contact pads 48.

As shown in FIG. 2, methods 200 includes recording, at 210, a base probe system image of at least a portion of the probe system and generating, at 220, the augmented probe system image at least partially based upon the base probe system image. The recording the base probe system image at 210 is performed with an imaging device, such as imaging device 50 disclosed herein and schematically illustrated in FIG. 1.

As used herein, a step of methods 200 that includes recording an image with the imaging device may be understood as encompassing any appropriate combination and/or sequence of steps for generating the image. For example, a step that includes recording an image with the imaging device may include the substeps of receiving light rays with the imaging device, generating an image with the imaging device based on the received light rays, transmitting a representation (e.g., an electrical signal) corresponding to the generated image to the controller, and/or storing the representation of the generated image with the imaging device and/or the controller. In this manner, a step that includes recording an image with the imaging device also may include substeps that are performed by the imaging device and/or by the controller.

The generating the augmented probe system image at 220 may be performed with a controller, such as controller 90 disclosed herein and schematically illustrated in FIG. 1. The generating the augmented probe system image at 220 may include generating a graphical representation of the augmented probe system image, and/or may include generating an electrical signal, a data signal, a data stream, etc. that encodes the augmented probe system image to be parsed and/or viewed in a display.

Examples of base probe system images that may be utilized (e.g., recorded, generated, etc.) in conjunction with methods 200 are disclosed herein with reference to base probe system image 54, an example of which is illustrated in FIG. 6. Examples of augmented probe system images that may be utilized (e.g., recorded, generated, etc.) in conjunction with methods 200 are disclosed herein with reference to augmented probe system image 70, an example of which is illustrated in FIG. 7.

As described in more detail herein, methods 200 include producing the augmented probe system image such that the augmented probe system image includes a representation of at least a portion of the probe system that is obscured by another portion of the probe system in the base probe system image. As examples, and as illustrated in FIG. 6, the base probe system image may be recorded such that one or more probe tips 130 of probe 120 and/or covered region 44 of substrate 40 are not visible. In such examples, methods 200 may include generating the augmented probe system image to include depictions of the probe tip(s) and/or of the covered region, such as to facilitate aligning each probe tip with a corresponding region and/or location of the substrate.

The recording the base probe system image at 210 may include recording such that the base probe system image depicts any of a variety of portions of the probe system. For example, the base probe system image may include an image of at least a portion of a substrate, such as a substrate that includes one or more DUTs. Additionally or alternatively, the base probe system image may include an image of at least a portion of a probe of the probe system, such as may be configured to test a corresponding DUT of the substrate.

In some examples, the recording the base probe system image at 210 includes recording such that the probe is proximal the substrate relative to the imaging device. Stated differently, in such examples, the probe is positioned between the substrate and the imaging device such that the probe covers and/or conceals at least a portion of the substrate that is within a field of view of the imaging device. In this manner, the recording the base probe system image at 210 may include recording a top view image of at least a portion of the probe system and/or of the substrate. Examples of substrates and/or of DUTs that may be utilized in conjunction with methods 200 are disclosed herein with reference to substrate 40 and/or DUTs 46, respectively, as schematically illustrated in FIG. 1. Similarly, examples of probe systems and/or of probes that may be utilized in conjunction with methods 200 are disclosed herein with reference to probe system 10 and/or probe 120, respectively, as schematically illustrated in FIG. 1.

In some examples, and as discussed above, each probe includes a probe body and a probe tip extending from the probe body and terminating in a probe tip end such that the probe tip end is configured to contact a corresponding DUT. In some such examples, the recording the base probe system image at 210 includes recording such that at least the probe tip end of the probe tip is covered and/or obscured by the probe body and/or by a probe beam of the probe body in the base probe system image. Accordingly, in some such examples, and as shown in FIG. 2, the generating the augmented probe system image includes generating, at 230, a virtual probe tip marker that is indicative of a location of the probe tip end of at least one probe. Stated differently, in such examples, the generating the augmented probe system image at 220 includes generating such that the augmented probe system image includes the virtual probe tip marker at a location corresponding to (e.g., nominally identical to) a location of the probe tip end that is hidden by the probe body and/or the probe beam, as viewed by the imaging device. In this manner, generating the augmented probe system image such that the augmented probe system image includes the virtual probe tip marker may enable and/or facilitate alignment between the probe tip and DUT, or a specific structure on the DUT, even when the probe tip itself is not visible to the imaging device. In some examples, the generating the virtual probe tip marker at 230 is performed with the controller.

As used herein, the term "nominally," as used to qualify a stated property and/or relationship of one or more locations and/or components, is intended to refer to a configuration in which the location(s) and/or component(s) are intended and/or configured to have exactly the stated property and/or relationship without requiring that the location(s) and/or component(s) actually have the exact stated property and/or relationship. In this manner, the term "nominally" is intended to encompass examples in which the location(s) and/or component(s) have the exact stated property and/or relationship, as well as examples in which the actual property and/or relationship differs from the stated property and/or relationship as a result of incidental factors such as measurement imprecision, manufacturing tolerances, thermal drift, etc. As a more specific example, a first component may be described as being positioned at a first location that is nominally identical to a second location when the first location is exactly identical to the second location, and also when the first location differs from the second location by an offset that is unintentional, unavoidable, and/or negligible for proper performance of probe system 10 and/or of methods 200.

Examples of probe bodies, probe beams, probe tips, and/or probe tip ends that may be utilized in conjunction with methods 200 are disclosed herein with reference to probe body 122, probe beam 124, probe tip 130, and/or probe tip end 132, respectively, as schematically illustrated in FIG. 1. Similarly, examples of virtual probe tip markers are disclosed herein with reference to virtual probe tip marker 72 as illustrated in FIGS. 1, 3, and 7. In particular, FIGS. 1, 3, and 7 illustrate examples in which virtual probe tip marker 72 takes the form of a circle. In other examples, the virtual probe tip marker may include and/or be any of a variety of visual markers and/or indicators, examples of which include a dot, a line, a cross, a geometrical figure, a square, etc.

For simplicity, the present disclosure generally describes aspects of methods 200 in the context of a single virtual probe tip marker that is generated to represent the position of a single probe tip of a single probe. However, it is to be understood that methods 200 also may pertain to generating the augmented probe system image to include any suitable number of virtual probe tip markers corresponding to any suitable number of probe tips that may be present but not visible within a field of view of the imaging device. In particular, FIG. 6 illustrates an example in which the base probe system image includes and/or graphically represents two probes, each of which has three corresponding probe tips (not visible in FIG. 6), while FIG. 7 illustrates a corresponding example in which the augmented probe system image includes six virtual probe tip markers, which are oriented, within the augmented probe system image, based upon a known, a determined, and/or a measured position of the probe tips. In examples in which the augmented probe system image illustrates a plurality of virtual probe tip markers, such virtual probe tip markers may be generated by repeating one or more steps of methods 200 for each probe, each probe tip, and/or each virtual probe tip marker, as appropriate.

The generating the virtual probe tip marker at 230 may be performed in any of a variety of manners. For example, and as shown in FIG. 2, the generating the virtual probe tip marker at 230 may include determining, at 232, a position of the probe tip end relative to the probe tip body. In such examples, and as shown in FIG. 2, the generating the augmented probe system image at 220 may include modifying, at 250, the base probe system image to include the virtual probe tip marker based on the determining the position of the probe tip end at 232. That is, in some such examples, the augmented probe system image may be at least substantially similar to the base probe system image aside from the introduction of the virtual probe tip marker in the augmented probe system image, which in turn may be at least partially based upon the determining the position of the probe tip end at 232. In some examples, the determining the position of the probe tip end at 232 and the modifying the base probe system image at 250 are performed with the controller.

The determining the position of the probe tip end at 232 may include any of a variety of direct and/or indirect measurements and/or determinations of the position of the probe tip end relative to a portion of the probe body, such as a top surface of the probe body that is visible to the imaging device. Stated differently, the determining the position of the probe tip end at 232 may include determining a location of the probe tip end within a plane perpendicular to the optical axis of the imaging device (such as optical axis 52 schematically illustrated in FIG. 1), such that the location of the probe tip end and the location of the virtual probe tip marker are nominally identical from the perspective of the imaging device.

In some examples, and as shown in FIG. 2, the determining the position of the probe tip end at 232 includes contacting, at 234, the substrate with the probe tip end to physically mark the substrate with the probe tip at a tip contact location. In such examples, and as shown in FIG. 2, the determining the position of the probe tip end at 232 additionally may include translating, at 240, the probe relative to the substrate by a probe displacement distance such that the tip contact location is uncovered by the probe and thus is visible to the imaging device. In such examples, and as shown in FIG. 2, the determining the position of the probe tip end at 232 further may include imaging, at 246 and with the imaging device, the tip contact location.

FIG. 4 is a schematic representation of a portion of probe system 10 and substrate 40 as schematically illustrated in FIG. 1 as viewed and/or imaged by imaging device 50 (shown in FIG. 1), and represents aspects of the generating the virtual probe tip marker at 230. Specifically, FIG. 4 schematically illustrates in dashed lines an initial position of probe 120 that includes probe tip 130 (as schematically illustrated in FIG. 1; not visible in FIG. 4) that is positioned between probe body 122 and substrate 40 such that the probe tip is concealed by the probe body from the perspective of the imaging device. As shown in FIG. 4, when probe 120 is in the position indicated in dashed lines in FIG. 4, the contacting the substrate with the probe tip end at 234 results in the probe tip end physically marking (e.g., visibly scratching and/or deforming) the substrate at a tip contact location 134. In the schematic example of FIG. 4, the translating the probe relative to the substrate at 240 corresponds to probe 120 shifting relative to substrate 40 by a probe displacement distance 128, from the position illustrated in dashed lines to the position illustrated in solid lines.

Stated differently, and as schematically illustrated in FIG. 4, probe displacement distance 128 represents a displacement between a position of probe 120 prior to the translating the probe relative to the substrate at 240 (illustrated in dashed lines) and a position of the probe subsequent to the translating the probe relative to the substrate at 240 (illustrated in solid lines).

In particular, probe displacement distance 128 represents a distance as measured along a direction parallel to a surface of substrate 40 and/or perpendicular to optical axis 52 (schematically illustrated in FIG. 1). As schematically illustrated in FIG. 4, the translating the probe relative to the substrate at 240 includes translating the probe such that tip contact location 134 is no longer covered by probe 120 and thus is visible to the imaging device.

Accordingly, the imaging the tip contact location at 246 thus includes recording an image of the tip contact location that has been made visible as a result of the translating the probe relative to the substrate at 240.

The value of the probe displacement distance corresponding to the translating the probe relative to the substrate at 240 may be any appropriate value that results in the tip contact location being visible to the imaging device. In some examples, the value of the probe displacement distance may be a predetermined value, such as a value that is based upon a dimension of the probe (e.g., a width of the probe body). In other examples, the value of the probe displacement distance may be empirically measured during and/or subsequent to the translating the probe relative to the substrate at 240, such as via a comparison of respective positions of the probe prior to and subsequent to the translating the probe relative to the substrate at 240.

The probe displacement distance may be measured, represented, stored, and/or utilized in the form of any of a variety of quantitative representations. For example, the value of the probe displacement distance may be at least partially represented as a quantity that is defined in units of distance and/or linear displacement, such as a measured and/or predetermined distance by which the probe is translated relative to the substrate. As another example, the value of the probe displacement distance may be at least partially represented as a relative distance and/or a proportion, such as a dimensionless quantity that represents a ratio of the probe displacement distance to another distance and/or a dimension associated with the probe system, such as a linear dimension of a portion of the probe, of a portion of the substrate, and/or of a field of view of the imaging device.

The contacting the substrate with the probe tip at 234 and/or the translating the probe relative to the substrate at 240 each may be performed in any appropriate manner, such as by moving the probe relative to the substrate and/or by moving the substrate relative to the probe. In this manner, a description of translating a first component relative to a second component equivalently may be described as translating the second component relative to the first component, and/or translating each of the first component and the second component relative to one another, in a manner that results in the described relative motion between the first component and the second component. As a more specific example, the contacting the substrate with the probe tip at 234 and/or the translating the probe relative to the substrate at 240 each may include moving the probe relative to the substrate with a probe manipulator that supports the probe, such as probe manipulator 110 schematically illustrated in FIG. 1. Additionally or alternatively, the contacting the substrate with the probe tip at 234 and/or the translating the probe relative to the substrate at 240 each may include moving the substrate relative to the probe with a chuck translation stage that supports the substrate, such as chuck translation stage 20 schematically illustrated in FIG. 1.

In some examples, the contacting the substrate with the probe tip at 234 includes moving the probe relative to the substrate and/or moving the substrate relative to the probe along a direction that is at least substantially perpendicular to a plane of the substrate, such as along the Z direction as shown in FIG. 1. Additionally or alternatively, in some examples, the translating the probe relative to the substrate at 240 includes moving the probe relative to the substrate and/or moving the substrate relative to the probe along a direction that is at least substantially parallel to a plane of the substrate, such as within the X-Y plane as shown in FIG. 1.

In some examples, the contacting the substrate with the probe tip at 234 and/or the translating the probe relative to the substrate at 240 is performed responsive to a control signal that is generated and/or transmitted by the controller. Specifically, in some examples, the moving the probe relative to the substrate includes generating, with the controller, a probe manipulator control signal and transmitting, with the controller, the probe manipulator control signal to the probe manipulator to command the probe manipulator to translate and/or rotate the probe relative to the chuck. Additionally or alternatively, in some examples, the moving the substrate relative to the probe includes generating, with the controller, a chuck translation stage control signal and transmitting, with the controller, the chuck translation stage control signal to the chuck translation stage to command the chuck translation stage to translate and/or rotate the chuck relative to the probe. Examples of probe manipulator control signals and/or chuck translation stage control signals that may be utilized in conjunction with methods 200 are disclosed herein with reference to probe manipulator control signal 92 and/or chuck translation stage control signal 94, respectively, as schematically illustrated in FIG. 1.

As shown in FIG. 2, the generating the virtual probe tip marker at 230 additionally may include assigning, at 248, a virtual probe tip location of the virtual probe tip marker. Stated differently, in such examples, the assigning the virtual probe tip location at 248 may include and/or be determining a location within the augmented probe system image and/or within a field of view of the imaging device at which the virtual probe tip marker is to be located. In particular, in such examples, the virtual probe tip location is a location as measured relative to a probe body reference structure associated with the probe. In some examples, the assigning the virtual probe tip location at 248 is performed with the controller.

FIG. 4 schematically illustrates an example in which probe 120 includes a probe body reference structure 126 in the form of a corner of probe body 122. In this example, the assigning the virtual probe tip location at 248 includes assigning and/or defining a virtual probe tip location 136 that is separated from the corner of the probe body by a virtual marker reference offset 138, as described in more detail herein. However, it is not required of all examples of probe system 10 and/or methods 200 that the virtual probe tip location be a corner of the probe body as schematically illustrated in FIG. 4. For example, it additionally is within the scope of the present disclosure that probe body reference structure 126 may be any of a variety of points, features, regions, and/or portions of probe 120, probe body 122, and/or probe beam 124, such as a point and/or feature that may be readily identified and/or located by imaging device 50. Stated differently, probe body reference structure 126 may be selected and/or identified such that the probe body reference structure may be uniquely and/or unambiguously located within an image generated by imaging device 50 as long as the probe body reference structure is within a field of view of the imaging device. As a more specific example, probe body reference structure 126 may include and/or be at least a portion of an outer perimeter (e.g., an outline) of probe body 122 as imaged by imaging device 50, such as a corner and/or a region of curvature of the outer perimeter of the probe body.

In examples in which the generating the virtual probe tip marker at 230 includes the assigning the virtual probe tip location at 248, the assigning the virtual probe tip location at 248 is based, at least in part, on the probe displacement distance as utilized and/or determined in the translating the probe relative to the substrate at 240, as well as on the imaging the tip contact location at 246, as described in more detail herein. In such examples, the presenting the augmented probe system image at 270 thus includes presenting the virtual probe tip marker at the virtual probe tip location, such as by modifying the base probe system image to include the virtual probe tip marker at the virtual probe tip location to indicate the location of the probe tip. In some examples, the determining the position of the probe tip end at 232 includes recording one or more images of the probe and/or the substrate, such as to determine and/or quantitatively measure locations of components and/or features of the probe and/or the substrate and/or to measure distances between such components. More specifically, in some examples, and as shown in FIG. 2, the determining the position of the probe tip end at 232 includes recording, at 236 and with the imaging device, a first calibration image in which the probe tip is nominally positioned at the tip contact location. In this manner, FIG. 4 may be described as schematically illustrating in dashed lines an example of the first calibration image.

Additionally or alternatively, in some examples, and as shown in FIG. 2, the determining the position of the probe tip end at 232 includes recording, at 242 and with the imaging device, a second calibration image in which the tip contact location is visible to the imaging device. That is, in such examples, the recording the second calibration image at 242 is performed subsequent to the translating the probe relative to the substrate at 240. In this manner, FIG. 4 also may be described as schematically illustrating in solid lines an example of the second calibration image. In some such examples, the recording the second calibration image at 242 may be described as including the imaging the tip contact location at 246. In such examples, and as described herein, the assigning the virtual probe tip location at 248 is based, at least in part, on the first calibration image and/or the second calibration image.

In some examples, and as discussed above, the translating the probe relative to the substrate at 240 includes translating the probe by a known (e.g., a predetermined) probe displacement distance. However, this is not required, and it is additionally within the scope of the present disclosure that the probe displacement distance may be independently measured and/or verified. In particular, in some examples, and as shown in FIG. 2, the determining the position of the probe tip end includes measuring, at 244, the probe displacement distance.

The measuring the probe displacement distance at 244 may be performed in any appropriate manner. In some examples, the measuring the probe displacement distance at 244 is at least partially based on the recording the first calibration image at 236 and the recording the second calibration image at 242. As a more specific example, the measuring the probe displacement distance at 244 may be based, at least in part, on a relative or absolute distance between the location of the probe reference structure as recorded in the first calibration image and the location of the probe reference structure as recorded in the second calibration image. That is, in such examples, the probe displacement distance may be calculated to be the difference between the location (e.g., the X-Y coordinates) of the probe reference structure in the first calibration image and the location (e.g., the X-Y coordinates) of the probe reference structure in the second calibration image. In some examples, the measuring the probe displacement distance at 244 is performed with the controller.

In some examples, and as further shown in FIG. 2, the determining the position of the probe tip end at 232 includes, subsequent to the contacting the substrate with the probe tip end at 234 and prior to the translating the probe relative to the substrate at 240, disengaging, at 238, the probe tip end from the substrate. The disengaging the probe tip end from the substrate at 238 may ensure that the subsequent translating the probe relative to the substrate at 240 is not performed while the probe tip end remains in contact with the substrate, which otherwise may yield undesirable wear and/or damage to probe 120 and/or substrate 40. In some examples, the disengaging the probe tip end from the substrate at 238 includes disengaging such that the probe tip end remains at least substantially aligned with (e.g., directly above) the tip contact location. This may ensure that a position of the visible portion of probe 120 relative to tip contact location 134, as viewed by imaging device 50, is at least substantially unchanged as a result of the disengaging the probe tip end from the substrate at 238.

The disengaging the probe tip end from the substrate at 238 may be performed in any appropriate manner, such as by moving the probe relative to the substrate and/or by moving the substrate relative to the probe. As a more specific example, the disengaging the probe tip end from the substrate at 238 may include moving the probe relative to the substrate with a probe manipulator that supports the probe, such as probe manipulator 110 schematically illustrated in FIG. 1. Additionally or alternatively, the disengaging the probe tip end from the substrate at 238 may include moving the substrate relative to the probe with a chuck translation stage that supports the substrate, such as chuck translation stage 20 schematically illustrated in FIG. 1.

In some examples, the disengaging the probe tip end from the substrate at 238 includes moving the probe relative to the substrate and/or moving the substrate relative to the probe along a direction at least substantially perpendicular to a plane of the substrate, such as along the Z direction as shown in FIG. 1. As more specific examples, the disengaging the probe tip end from the substrate at 238 may include controlling the probe manipulator and/or the chuck translation stage with the controller, such as by transmitting the probe manipulator control signal to the probe manipulator and/or by transmitting the chuck translation stage control signal to the chuck translation stage.

In some examples, the assigning the virtual probe tip location at 248 is at least partially based upon one or both of the recording the first calibration image at 236 and the recording the second calibration image at 242. As discussed, the assigning the virtual probe tip location at 248 generally includes assigning with reference to the probe body reference structure. As a more specific example, and as discussed with reference to FIG. 4, the assigning the virtual probe tip location at 248 may include assigning such that the virtual probe tip location is offset from the probe body reference structure by a virtual marker reference offset, such as virtual marker reference offset 138 schematically illustrated in FIG. 4. Specifically, and as schematically illustrated in FIG. 4, virtual marker reference offset 138 is equal to an offset (e.g., a displacement) between tip contact location 134 (as determined via the imaging the tip contact location at 246) and the location of probe body reference structure 126 during the contacting the substrate with the probe tip end at 234 (as determined prior to and/or subsequent to the disengaging the probe tip end from the substrate at 238).

In some examples, virtual marker reference offset 138 corresponds to an offset (e.g., a displacement) between tip contact location 134 and probe body reference structure 126 as measured in (e.g., projected onto) a plane of substrate 40, such as the X-Y plane as shown in FIG. 4. As a more specific example, and with reference to FIG. 4, the recording the first calibration image at 236 may include determining and/or recording the location (e.g., the X-Y coordinates) of probe body reference structure 126, and the imaging the tip contact location at 246 and/or the recording the second calibration image at 242 may include determining and/or recording the location (e.g., the X-Y coordinates) of tip contact location 134.

Accordingly, in such examples, and as schematically illustrated in FIG. 4, the virtual marker reference offset 138 may be calculated as the difference between tip contact location 134 and the location of probe body reference structure 126 as recorded in the first calibration image. More specifically, in such examples, the virtual marker reference offset may have an X-coordinate that is equal to the difference between the respective X-coordinates of the tip contact location and the location of the probe body reference structure, and the virtual marker reference offset may have a Y-coordinate that is equal to the difference between the respective Y-coordinates of the tip contact location and the location of the probe body reference structure. Thus, in such examples, and as schematically illustrated in FIG. 4, the assigning the virtual probe tip location at 248 may include locating virtual probe tip location 136 to be positioned such that a difference (e.g., a two-dimensional offset) between virtual probe tip location 136 and a location of probe body reference structure 126 is nominally equal to virtual marker reference offset 138.

In some examples, and as discussed, the determining the position of the probe tip end at 232 includes physically contacting the substrate with the probe tip end such that the tip contact location is visible to the imaging device, at least when the tip contact location is not obscured by the probe. Accordingly, in some examples, one or more steps of the determining the position of the probe tip end at 232, such as the contacting the substrate with the probe tip end at 234, are performed at a location of the substrate that is spatially removed from the DUT that is to be tested by the probe. In particular, in an example in which the determining the position of the probe tip end at 232 includes physically marking the substrate, physically marking the substrate at a location that is spatially removed from the DUT may ensure that the DUT is not damaged by physically contacting the substrate with the probe tip end. More specifically, in an example in which the substrate includes one or more DUTs, the contacting the substrate with the probe tip at 234 may include contacting such that the tip contact location is within a calibration region of the substrate that is spaced apart from the DUT(s). Alternatively, in some examples, one or more steps of the determining the position of the probe tip end at 232, such as the contacting the substrate with the probe tip end at 234, may be performed on a substrate that is free of DUTs, such as a blank substrate and/or a calibration substrate. In such examples, the blank substrate and/or the calibration substrate may be described as including, or being, the calibration region. FIG. 4 schematically illustrates an example in which tip contact location 134 is positioned within a calibration region 42 of substrate 40.

In some examples, the recording the base probe system image at 210, the imaging the tip contact location at 246, the recording the first calibration image at 236, and/or the recording the second calibration image at 242 are performed with the same single imaging device, such as imaging device 50 that is schematically illustrated in FIG. 1. Stated differently, each of the base probe system image, the first calibration image, the second calibration image, and/or an image of the tip contact location produced during the imaging the tip contact location at 246 may be recorded by the same single imaging device. However, this is not required, and it additionally is within the scope of the present disclosure that more than one imaging device may be utilized in various steps of methods 200. More specifically, in some examples, two or more of the base probe system image, the first calibration image, the second calibration image, and the image of the tip contact location may be recorded by respective distinct imaging devices. In such examples, each such imaging device is positioned relative to the probe and/or the substrate in the manner described herein with reference to imaging device 50 schematically illustrated in FIG. 1. That is, in an example in which multiple imaging devices are utilized in the performance of methods 200, each imaging device generally is configured to produce a top view of the probe and/or of the substrate, as described herein.

In some examples, and as discussed above, probe 120 may include a plurality of probe tips 130 configured to contact substrate 40 at a plurality of respective tip contact locations 134. In such examples, the generating the augmented probe system image at 220 may include repeating the generating the virtual probe tip marker at 230 for each probe tip of the plurality of probe tips. In this manner, the generating the augmented probe system image at 220 may include generating separate augmented probe system images for each probe tip (e.g., such that each augmented probe system image includes a respective virtual tip marker), or may include generating a single augmented probe system image that includes respective virtual tip markers for each of the plurality of probe tips. FIG. 3 schematically illustrates an example in which augmented probe system image 70 includes three virtual probe tip markers 72 that identify the locations of three corresponding probe tips 130 of probe 120 (as schematically illustrated in FIG. 1).

The foregoing discussion of methods 200 generally relates to examples in which the augmented probe system image includes one or more virtual probe tip markers to visually indicate the respective locations of one or more probe tips relative to a visible portion of the corresponding probe(s). In some examples of methods 200, the augmented probe system image additionally or alternatively may be generated such that a portion of the substrate that is visually obscured by the probe(s) is itself visible and/or graphically represented in the augmented probe system image. That is, in some examples, and as schematically illustrated in FIG. 1, probe 120 may be positioned relative to substrate 40 such that probe body 122 and/or probe beam 124 obscures covered region 44 of substrate 40 from view by imaging device 50.

Accordingly, in such examples, the recording the base probe system image at 210 includes recording such that covered region 44 is obscured by at least a portion of probe body 122 and thus is not visible to imaging device 50 and is not represented in the base probe system image. Accordingly, in some such examples, and as described in more detail herein, the generating the augmented probe system image at 220 includes generating such that the covered region is at least partially visible and/or graphically represented in the augmented probe system image. As a more specific example, and as schematically illustrated in FIG. 3, covered region 44 of substrate 40 may include DUT 46 and/or one or more contact pads 48 thereof, and the generating the augmented probe system image at 220 may include generating such that augmented probe system image 70 includes a graphical representation of DUT 46 and/or of the one or more contact pads 48 in covered region 44.

The augmented probe system image may be generated to include a graphical representation of one or more components in the covered region in any of a variety of manners.

In some examples, and as shown in FIG. 2, methods 200 further include recording, at 202 and with an imaging device, a reference substrate image of at least a portion of the substrate that is at least substantially unobscured by the probe. For example, the recording the reference substrate image at 202 may include recording an image of a portion of the substrate that corresponds to the covered region of the substrate during operative use of the probe to test the DUT but that is uncovered during the recording the reference substrate image at 202. That is, as used herein, the term "covered region" is intended to refer to a region of the substrate that is at least partially covered and/or visually obscured by at least a portion of the probe during operative use of the probe to test the DUT, but which is not necessarily always covered and/or obscured by the probe during the performance of various steps of methods 200. Thus, the recording the reference substrate image at 202 may be performed while the probe is positioned away from the portion of the substrate represented in the reference substrate image and/or while the probe is out of focus to the imaging device relative to the reference substrate image. In some examples, the recording the reference substrate image at 202 is performed prior to the recording the base probe system image at 210. Examples of imaging devices and/or the reference substrate images that may be utilized in conjunction with methods 200 including the recording the reference substrate image at 202 are disclosed herein with reference to imaging device 50 of FIG. 1 and/or reference substrate image 76 of FIG. 5, respectively.

In an example in which the augmented probe system image includes a graphical representation of the covered region of the substrate, the generating the augmented probe system image at 220 may include any suitable steps for utilizing the reference substrate image to this end. In some such examples, and as shown in FIG. 2 and described in more detail herein, the generating the augmented probe system image at 220 includes combining, at 260, the reference substrate image and the base probe system image such that the augmented probe system image includes a graphical representation of at least a portion of the covered region of the substrate. In some examples, the combining the reference substrate image and the base probe system image at 260 is performed with the controller.

FIGS. 5-7 illustrate examples of images that may be generated, produced, and/or utilized in the performance of methods 200 that include the combining the reference substrate image and the base probe system image at 260. In particular, FIG. 5 illustrates an example of reference substrate image 76, such as may be produced by the recording the reference substrate image at 202, while FIG. 6 illustrates an example of base probe system image 54, such as may be produced by the recording the base probe system image at 210. FIG. 7 illustrates an example of augmented probe system image 70, such as may be produced by combining reference substrate image 76 of FIG. 5 and base probe system image 54 of FIG. 6, as described herein. FIG. 7 additionally illustrates an example in which augmented probe system image 70 includes a plurality of virtual probe tip markers 72, as discussed above.

The combining the reference substrate image and the base probe system image at 260 may include combining such that the augmented probe system image includes any appropriate respective portions, or representations, of the reference substrate image and the base probe system image. For example, and as described herein, the combining the reference substrate image and the base probe system image at 260 may include combining such that the augmented probe system image includes a graphical representation of a portion of the substrate (e.g., the covered region) that is visible in the reference substrate image but that is not visible in the base probe system image.

As a more specific example, and as illustrated in FIG. 7, the combining the reference substrate image and the base probe system image at 260 may include combining such that augmented probe system image 70 illustrates a portion of probe body 122 as being at least partially transparent. In particular, in the example of FIG. 7, the portion of probe body 122 that obscures covered region 44 of substrate 40 in base probe system image 54 shown in FIG. 6 is graphically represented as being at least partially transparent. In some examples, the combining the reference substrate image and the base probe system image at 260 includes combining such that the augmented probe system image illustrates the portion of the probe body that obscures the covered region as being at least substantially transparent and as being encompassed and/or bounded by an outline that represents a peripheral edge of the probe body as viewed by the imaging device. As a more specific example, the combining the reference substrate image and the base probe system image at 260 may include combining such that the augmented probe system image illustrates the probe primarily and/or solely as an outline of the probe body, which further may be marked and/or annotated by one or more virtual probe tip markers as described above. Stated differently, in such examples, the generating the augmented probe system image at 220 may include each of the generating the virtual probe tip marker at 230 and the combining the reference substrate image and the base probe system image at 260 such that the probe is graphically represented as an outline of the probe body in combination with one or more virtual probe tip markers.

While the foregoing discussion relates to examples in which a single and/or static augmented probe system image is produced by manipulating a single and/or static base probe system image and/or a single and/or static reference substrate image, this is not required of all examples of methods 200. For example, it also is within the scope of the present disclosure that the augmented probe system image be produced as a sequence of images and/or as a video stream, such as may be at least partially based upon a base probe system image and/or a reference substrate image that also takes the form of a sequence of images and/or a video stream.

In this manner, in some examples, method 200 (and/or one or more steps thereof) may be performed at least substantially continuously, such that the generating the augmented probe system image at 220 includes generating such that the augmented probe system image represents a live and/or real-time view of probe system 10.

As a more specific example, and as illustrated in FIG. 6, base probe system image 54 may include and/or be a real-time probe image 78 of a portion of probe 120 that is visible to imaging device 50 (schematically illustrated in FIG. 1) and/or a real-time substrate image 74 of a portion of substrate 40 that is visible to the imaging device. Stated differently, in such examples, imaging device 50 may be configured to generate, record, transmit, etc. a sequence of images and/or a video stream corresponding to base probe system image 54 such that the sequence of images and/or the video stream includes real-time substrate image 74 and/or real-time probe image 78. In this manner, each of real-time substrate image 74 and/or real-time probe image 78 may include and/or be a sequence of images and/or a video stream. In such examples, with reference to FIG. 2 and as illustrated in FIGS. 3 and 7, the combining the reference substrate image and the base probe system image at 260 may include combining such that augmented probe system image 70 (as shown in FIGS. 3 and 7) includes a reproduction and/or representation of at least a portion of reference substrate image 76 in addition to one or both of a real-time probe representation 82 and/or a real-time substrate representation 84. In particular, in such examples, real-time probe representation 82 includes a reproduction and/or representation of at least a portion of real-time probe image 78, and real-time substrate representation 84 includes a reproduction and/or representation of at least a portion of real-time substrate image 74.

In some examples of methods 200, the combining the reference substrate image and the base probe system image at 260 may include reducing an opacity of at least a portion of a real-time probe image such that a real-time probe representation illustrates the probe body as being at least partially transparent. Examples of real-time probe images and/or real-time probe representations that may be utilized in conjunction with methods 200 are disclosed herein with reference to real-time probe image 78 and/or real-time probe representation 82, respectively. In particular, and as discussed herein, examples of real-time probe image 78 are schematically illustrated in FIG. 3 and less schematically illustrated in FIG. 6, while an example of real-time probe representation 82 is illustrated in FIG. 7.

In such examples of methods 200, the combining the reference substrate image and the base probe system image at 260 additionally may include superimposing the real-time probe representation on the reference substrate image such that at least a portion of the reference substrate image is at least partially visible under the reduced-opacity real-time probe representation. In such examples, the superimposing the real-time probe representation on the reference substrate image may include rescaling and/or resizing one or both of the real-time probe representation and the reference substrate image. In particular, rescaling and/or resizing the real-time probe representation and/or the reference substrate image may be performed such that an apparent size of the probe in the real-time probe representation relative to the apparent size of the substrate in the reference substrate image accurately represents the relative dimensions of the probe and the substrate. Additionally or alternatively, the combining the reference substrate image and the base probe system image at 260 may include reducing an opacity of at least a portion of the reference substrate image, and superimposing the reference substrate image on the real-time probe representation such that at least a portion of the real-time probe representation is at least partially visible under the reduced-opacity reference substrate image.

In some examples, reducing the opacity of at least a portion of the real-time probe image includes reducing the opacity such that a peripheral edge region of the probe body is more opaque and/or visible than a central region of the probe body that is encompassed by the peripheral edge region. For example, reducing the opacity of at least a portion of the real-time probe image may include reducing the opacity of a portion of the real-time probe image corresponding to the peripheral edge region of the probe body and reducing the opacity of a portion of the real-time probe image corresponding to a central region of the probe body by distinct degrees. In some examples, reducing the opacity of at least a portion of the real-time probe image and/or reducing the opacity of at least a portion of the real-time substrate image is performed automatically and/or with the controller. In such examples, the controller may be configured to reduce the opacity of at least a portion of the real-time probe image and/or of the real-time substrate by a predetermined degree. Additionally or alternatively, the controller may be configured to receive a user input that specifies the degree to which the opacity is to be reduced.

In some examples, a position of substrate 40 relative to imaging device 50 (e.g., within the X-Y plane schematically illustrated in FIG. 1) may shift and/or drift without intentionally moving substrate 40 relative to imaging device 50, such as due to thermal variations. Accordingly, in such examples, an image of substrate 40 within reference substrate image 76 (e.g., as recorded during the recording the reference substrate image at 202) may not remain perfectly aligned with an image of substrate 40 within base probe system image 54 and/or real-time substrate image 74. Thus, to accommodate such examples, and as shown in FIG. 2, the combining the reference substrate image and the base probe system image at 260 may include comparing, at 262, the real-time substrate image to the reference substrate image to determine a substrate image offset of the real-time substrate image relative to the reference substrate image (e.g., within a plane of the substrate). In such examples, and as shown in FIG. 2, the combining the reference substrate image and the base probe system image at 260 further may include shifting, at 264, the reference substrate image relative to the real-time probe representation by the substrate image offset such that the position of the reference substrate image relative to the real-time probe representation, as viewed by the imaging device, is nominally identical to the position of the real-time substrate image (and/or of the substrate itself) relative to the real-time probe image (and/or the probe itself).

The comparing the real-time substrate image to the reference substrate image at 262 and/or the shifting the reference substrate image at 264 may be performed in any suitable manner. For example, the comparing the real-time substrate image to the reference substrate image at 262 may include identifying a feature of the substrate, such as a DUT and/or a contact pad thereof, that is visible in each of the real-time substrate image and the reference substrate image and measuring an offset between the position of the feature in the real-time substrate image and in the reference substrate image. As a more specific example, the comparing the real-time substrate image to the reference substrate image at 262 may include determining X-Y coordinates associated with the location of the feature of the substrate in each of the real-time substrate image and the reference substrate image. In such examples, the comparing the real-time substrate image to the reference substrate image at 262 thus may include determining the substrate image offset as a two-dimensional offset that represents the difference between the respective X-coordinates and the difference between the respective Y-coordinates of the feature in each of the real-time substrate image and the reference substrate image. Accordingly, in some such examples, the shifting the reference substrate image at 264 may include shifting each of the features graphically represented in the reference substrate image by an offset corresponding to (e.g., equal to, or equal to the inverse of) the substrate image offset. In some examples, the comparing the real-time substrate image to the reference substrate image at 262 and/or the shifting the reference substrate image at 264 is/are performed automatically and/or with the controller. However, this is not required of all examples of methods 200, and it additionally is within the scope of the present disclosure that the comparing the real-time substrate image to the reference substrate image at 262 and/or the shifting the reference substrate image at 264 may be performed at least partially manually, such as responsive to a user input.

The combining the reference substrate image and the base probe system image at 260 may include combining such that the augmented probe system image includes any appropriate combination of the reference substrate image, the real-time substrate representation, the real-time probe representation, and/or any other representation of a portion of the probe system and/or of the substrate. For example, the combining the reference substrate image and the base probe system image at 260 may include combining such that the augmented probe system image includes a graphical representation of the reference substrate image both within the covered region and outside of the covered region. However, this is not required, and it additionally is within the scope of the present disclosure that the combining the reference substrate image and the base probe system image at 260 includes combining such that the augmented probe system image includes the reference substrate image within the covered region and includes the real-time substrate representation outside of the covered region. For the purposes of this description, the term "covered region," as used to describe a region of reference substrate image 76, of augmented probe system image 70, and/or a component and/or portion thereof, generally refers to a region corresponding to (e.g., coextensive with) covered region 44 of substrate 40 that is covered by probe body 122 during operative use of probe system 10 to test DUT(s) 46.

In some examples, the generating the augmented probe system image at 220 includes generating such that the augmented probe system image includes a representation of the probe other than the representation that is presented in real-time probe representation 82. As an example, and as shown in FIG. 2, methods 200 additionally may include, prior to the generating the augmented probe system image at 220, recording, at 204 and with the imaging device, a reference probe image of a portion of the probe, such as a portion of the probe that obscures the covered region of the substrate. In such examples, and as illustrated in FIG. 7, the combining the reference substrate image and the base probe system image at 260 may include combining such that augmented probe system image 70 includes a reproduction and/or representation of at least a portion of reference substrate image 76 as well as a reference probe representation 80 that includes a reproduction and/or representation of at least a portion of the reference probe image. As a more specific example, the reference probe representation may be formed by reducing an opacity of the reference probe image such that at least a portion of the probe body is represented as being at least partially transparent. In some examples, and as illustrated in FIG. 7, the combining the reference substrate image and the base probe system image at 260 may include combining such that augmented probe system image 70 includes reference probe representation 80 in addition to one or both of reference substrate image 76 and real-time substrate representation 84.

Similar to the aforementioned examples in which the combining the reference substrate image and the base probe system image at 260 includes reducing the opacity of at least a portion of real-time probe image 78 and/or reducing the opacity of at least a portion of the real-time substrate image, reducing the opacity of at least a portion of the reference probe image may be performed in any suitable manner. For example, reducing the opacity of at least a portion of the reference probe image may include reducing the opacity of a portion of the reference probe image corresponding to the peripheral edge region of the probe body and reducing the opacity of a portion of the reference probe image corresponding to a central region of the probe body by distinct degrees. In some examples, reducing the opacity of at least a portion of the reference probe image is performed automatically and/or with the controller. In such examples, the controller may be configured to reduce the opacity of at least a portion of the reference probe image by a predetermined degree. Additionally or alternatively, the controller may be configured to receive a user input that specifies the degree to which the opacity is to be reduced.

In some examples, and as shown in FIG. 2, methods 200 further include presenting, at 270, the augmented probe system image. In such examples, the presenting the augmented probe system image at 270 includes presenting with a display, such as display 60 disclosed herein and schematically illustrated in FIG. 1. In this manner, the presenting the augmented probe system image at 270 may include presenting the augmented probe system image to a user of the probe system, such as to facilitate aligning each probe with the corresponding DUT. In some examples, the presenting the augmented probe system image at 270 includes generating, with the controller, an augmented probe system image signal and transmitting the augmented probe system image signal to the display. Examples of augmented probe system image signals that may be utilized in conjunction with methods 200 are disclosed herein with reference to augmented probe system image signal 96, as schematically illustrated in FIG. 1.

As used herein, the term "and/or" placed between a first entity and a second entity means one of (1) the first entity, (2) the second entity, and (3) the first entity and the second entity. Multiple entities listed with "and/or" should be construed in the same manner, i.e., "one or more" of the entities so conjoined. Other entities may optionally be present other than the entities specifically identified by the "and/or" clause, whether related or unrelated to those entities specifically identified. Thus, as a non-limiting example, a reference to "A and/or B," when used in conjunction with open-ended language such as "comprising" may refer, in one embodiment, to A only (optionally including entities other than B); in another embodiment, to B only (optionally including entities other than A); in yet another embodiment, to both A and B (optionally including other entities). These entities may refer to elements, actions, structures, steps, operations, values, and the like.

As used herein, the phrase "at least one," in reference to a list of one or more entities should be understood to mean at least one entity selected from any one or more of the entity in the list of entities, but not necessarily including at least one of each and every entity specifically listed within the list of entities and not excluding any combinations of entities in the list of entities. This definition also allows that entities may optionally be present other than the entities specifically identified within the list of entities to which the phrase "at least one" refers, whether related or unrelated to those entities specifically identified. Thus, as a non-limiting example, "at least one of A and B" (or, equivalently, "at least one of A or B," or, equivalently "at least one of A and/or B") may refer, in one embodiment, to at least one, optionally including more than one, A, with no B present (and optionally including entities other than B); in another embodiment, to at least one, optionally including more than one, B, with no A present (and optionally including entities other than A); in yet another embodiment, to at least one, optionally including more than one, A, and at least one, optionally including more than one, B (and optionally including other entities). In other words, the phrases "at least one," "one or more," and "and/or" are open-ended expressions that are both conjunctive and disjunctive in operation. For example, each of the expressions "at least one of A, B and C," "at least one of A, B, or C," "one or more of A, B, and C," "one or more of A, B, or C" and "A, B, and/or C" may mean A alone, B alone, C alone, A and B together, A and C together, B and C together, A, B and C together, and optionally any of the above in combination with at least one other entity.

As used herein the terms "adapted" and "configured" mean that the element, component, or other subject matter is designed and/or intended to perform a given function. Thus, the use of the terms "adapted" and "configured" should not be construed to mean that a given element, component, or other subject matter is simply "capable of" performing a given function but that the element, component, and/or other subject matter is specifically selected, created, implemented, utilized, programmed, and/or designed for the purpose of performing the function. It is also within the scope of the present disclosure that elements, components, and/or other recited subject matter that is recited as being adapted to perform a particular function may additionally or alternatively be described as being configured to perform that function, and vice versa.

As used herein, the phrase "at least substantially," when modifying a degree or relationship, includes not only the recited "substantial" degree or relationship, but also the full extent of the recited degree or relationship. A substantial amount of a recited degree or relationship may include at least 75% of the recited degree or relationship. For example, a first direction that is at least substantially parallel to a second direction includes a first direction that is within an angular deviation of 22.5° relative to the second direction and also includes a first direction that is identical to the second direction.

As used herein, the terms "selective" and "selectively," when modifying an action, movement, configuration, or other activity of one or more components or characteristics of an apparatus, mean that the specific action, movement, configuration, or other activity is a direct or indirect result of one or more dynamic processes, as described herein. The terms "selective" and "selectively" thus may characterize an activity that is a direct or indirect result of user manipulation of an aspect of, or one or more components of, the apparatus, or may characterize a process that occurs automatically, such as via the mechanisms disclosed herein.

As used herein, the phrase, "for example," the phrase, "as an example," and/or simply the term "example," when used with reference to one or more components, features, details, structures, and/or embodiments according to the present disclosure, are intended to convey that the described component, feature, detail, structure, and/or embodiment is an illustrative, non-exclusive example of components, features, details, structures, and/or embodiments according to the present disclosure. Thus, the described component, feature, detail, structure, and/or embodiment is not intended to be limiting, required, or exclusive/exhaustive; and other components, features, details, structures, and/or embodiments, including structurally and/or functionally similar and/or equivalent components, features, details, structures, and/or embodiments, are also within the scope of the present disclosure.

In the present disclosure, several of the illustrative, non-exclusive examples have been discussed and/or presented in the context of flow diagrams, or flow charts, in which the methods are shown and described as a series of blocks, or steps. Unless specifically set forth in the accompanying description, it is within the scope of the present disclosure that the order of the blocks may vary from the illustrated order in the flow diagram, including with two or more of the blocks (or steps) occurring in a different order, concurrently, and/or repeatedly. It is also within the scope of the present disclosure that the blocks, or steps, may be implemented as logic, which also may be described as implementing the blocks, or steps, as logics. In some applications, the blocks, or steps, may represent expressions and/or actions to be performed by functionally equivalent circuits or other logic devices. The illustrated blocks may, but are not required to, represent executable instructions that cause a computer, processor, and/or other logic device to respond, to perform an action, to change states, to generate an output or display, and/or to make decisions.

The various disclosed elements of apparatuses and systems and steps of methods disclosed herein are not required to all apparatuses, systems, and methods according to the present disclosure, and the present disclosure includes all novel and non-obvious combinations and subcombinations of the various elements and steps disclosed herein. Moreover, one or more of the various elements and steps disclosed herein may define independent inventive subject matter that is separate and apart from the whole of a disclosed apparatus, system, or method. Accordingly, such inventive subject matter is not required to be associated with the specific apparatuses, systems, and methods that are expressly disclosed herein and such inventive subject matter may find utility in apparatuses, systems, and/or methods that are not expressly disclosed herein.

Illustrative, non-exclusive examples of probe systems and methods according to the present disclosure are presented in the following enumerated paragraphs:

A1. A method of producing an augmented probe system image representing a portion of a probe system, the method comprising:
  recording, with an imaging device, a base probe system image of at least a portion of the probe system; and
  generating, with a controller and based, at least in part, on the base probe system image, the augmented probe system image;
  wherein the augmented probe system image includes a representation of at least a portion of the probe system that is obscured by another portion of the probe system in the base probe system image.

A2. The method of paragraph A1, wherein the base probe system image includes one or both of:
  (i) an image of at least a portion of a substrate, optionally a substrate that includes one or more devices under test (DUTs); and
  (ii) an image of at least a portion of a probe of the probe system, optionally a probe that is configured to test a corresponding DUT of the one or more DUTs.

A3. The method of any of paragraphs A1-A2, further comprising:
  presenting, with a display, the augmented probe system image.

A4. The method of paragraph A3, wherein the presenting the augmented probe system image includes generating, with the controller, an augmented probe system image signal that represents the augmented probe system image and transmitting, with the controller, the augmented probe system image signal to the display.

A5. The method of any of paragraphs A2-A4, wherein the recording the base probe system image includes recording such that one or both of:
  (i) the probe is proximal the substrate relative to the imaging device; and
  (ii) the probe is positioned between the substrate and the imaging device.

A6. The method of any of paragraphs A1-A5, wherein the recording the base probe system image includes recording a top view image of at least a portion of one or both of the probe system and the substrate.

A7. The method of any of paragraphs A1-A6, wherein the imaging device is a single imaging device; and wherein the recording the base probe system image is performed with the single imaging device.

A8. The method of any of paragraphs A2-A7, wherein the probe includes:
  a probe body; and
  a probe tip extending from the probe body and terminating in a probe tip end for contacting the corresponding DUT;
  wherein the recording the base probe system image includes recording such that at least the probe tip end of the probe tip is obscured by the probe body; and
  wherein the generating the augmented probe system image includes generating a virtual probe tip marker that is indicative of a location of the probe tip end.

A9. The method of paragraph A8, wherein the probe body includes a probe beam; and wherein the probe tip extends from the probe beam.

A10. The method of paragraph A9, wherein the recording the base probe system image includes recording such that at least the probe tip end of the probe tip is obscured by the probe beam.

A11. The method of any of paragraphs A8-A10, wherein the generating the virtual probe tip marker includes determining, optionally with the controller, a position of the probe tip end relative to the probe body; and wherein the generating the augmented probe system image includes modifying, optionally with the controller, the base probe system image to include the virtual probe tip marker based, at least in part, on the determining the position of the probe tip end.

A12. The method of paragraph A11, wherein the determining the position of the probe tip end includes:
  contacting the substrate with the probe tip end to physically mark the substrate with the probe tip at a tip contact location;
  translating the probe relative to the substrate by a probe displacement distance such that the tip contact location is visible to the imaging device; and
  imaging, with the imaging device, the tip contact location; and
  wherein the generating the virtual probe tip marker includes assigning, optionally with the controller, a virtual probe tip location of the virtual probe tip marker relative to a probe body reference structure of the probe body based, at least in part, on the probe displacement distance and the imaging the tip contact location.

A13. The method of paragraph A12, wherein the probe body reference structure includes at least a portion of an outer perimeter of the probe body as imaged by the imaging device.

A14. The method of any of paragraphs A12-A13, wherein the determining the position of the probe tip end further includes, subsequent to the contacting the substrate with the probe tip end and prior to the translating the probe relative to the substrate, disengaging the probe tip end from the substrate such that the probe tip end remains nominally aligned with the tip contact location.

A15. The method of any of paragraphs A12-A14, wherein the assigning the virtual probe tip location includes assigning such that the virtual probe tip location is offset from the probe body reference structure by a virtual marker reference offset that is equal to an offset between the tip contact location, as determined via the imaging the tip contact location, and the location of the probe body reference structure during the contacting the substrate with the probe tip end.

A16. The method of any of paragraphs A12-A15, wherein the imaging the tip contact location and the recording the base probe system image are performed with a/the single imaging device.

A17. The method of any of paragraphs A12-A16, wherein the substrate includes the one or more DUTs, and wherein the contacting the substrate with the probe tip includes contacting such that the tip contact location is within a calibration region of the substrate that is spaced apart from the one or more DUTs.

A18. The method of any of paragraphs A12-A17, when dependent from paragraph A3, wherein the presenting the augmented probe system image includes presenting the virtual probe tip marker at the virtual probe tip location.

A19. The method of any of paragraphs A12-A18, wherein the probe displacement distance is a predetermined distance.

A20. The method of any of paragraphs A12-A19, wherein the determining the position of the probe tip end further includes one or both of:
  recording, with the imaging device, a first calibration image in which the probe tip is nominally positioned at the tip contact location; and
  subsequent to the translating the probe relative to the substrate, recording, with the imaging device, a second calibration image in which the tip contact location is visible; and
  wherein the assigning the virtual probe tip location is based, at least in part, on one or both of the first calibration image and the second calibration image.

A21. The method of paragraph A20, wherein the determining the position of the probe tip end further includes measuring, optionally with the controller, the probe displacement distance to be a distance between a location of the probe body reference structure as recorded in the first calibration image and a location of the probe body reference structure as recorded in the second calibration image.

A22. The method of any of paragraphs A20-A21, wherein the recording the first calibration image and the recording the second calibration image are performed with a/the single imaging device.

A23. The method of any of paragraphs A12-A22, wherein the contacting the substrate with the probe tip end includes one or both of:
  (i) moving the probe relative to the substrate, optionally with a probe manipulator that operatively supports the probe; and
  (ii) moving the substrate relative to the probe, optionally with a chuck translation stage that operatively supports a chuck that supports the substrate.

A24. The method of any of paragraphs A14-A23, wherein the disengaging the probe tip end from the substrate includes one or both of:
  (i) moving the probe relative to the substrate, optionally with a/the probe manipulator that operatively supports the probe; and
  (ii) moving the substrate relative to the probe, optionally with a/the chuck translation stage that operatively supports the chuck.

A25. The method of any of paragraphs A12-A24, wherein the translating the probe relative to the substrate includes one or both of:
  (i) moving the probe relative to the substrate along a direction at least substantially parallel to a plane of the substrate, optionally with a/the probe manipulator that operatively supports the probe; and
  (ii) moving the substrate relative to the probe along a direction at least substantially parallel to the plane of the substrate, optionally with a/the chuck translation stage that operatively supports the chuck.

A26. The method of any of paragraphs A23-A25, wherein the moving the probe relative to the substrate includes generating, with the controller, a probe manipulator control signal and transmitting, with the controller, the probe manipulator control signal to the probe manipulator to command the probe manipulator to translate and/or rotate the probe relative to the chuck.

A27. The method of any of paragraphs A23-A26, wherein the moving the substrate relative to the probe includes generating, with the controller, a chuck translation stage control signal and transmitting, with the controller, the chuck translation stage control signal to the chuck translation stage to command the chuck translation stage to translate and/or rotate the chuck relative to the probe.

A28. The method of any of paragraphs A8-A27, wherein the probe includes a plurality of probe tips; wherein the probe tip is a first probe tip of the plurality of probe tips; and wherein the generating the augmented probe system image includes repeating the generating the virtual probe tip marker for each probe tip of the plurality of probe tips.

A29. The method of any of paragraphs A2-A28, wherein the probe includes a/the probe body; wherein the recording the base probe system image includes recording such that a covered region of the substrate is obscured by at least a portion of the probe body and is not visible to the imaging device; and wherein the generating the augmented probe system image includes generating such that the augmented probe system image includes a graphical representation of at least a portion of the covered region.

A30. The method of paragraph A29, wherein the corresponding DUT includes one or more contact pads to be contacted by a/the probe tip of the probe; wherein the covered region of the substrate includes at least one of the one or more contact pads, and wherein the generating the augmented probe system image includes generating such that the augmented probe system image includes a graphical representation of at least a portion of the at least one contact pad in the covered region.

A31. The method of any of paragraphs A29-A30, further comprising:
  recording, with the imaging device, a reference substrate image of a portion of the substrate that is at least substantially unobscured by the probe; and
  wherein the generating the augmented probe system image includes combining, optionally with the controller, the reference substrate image and the base probe system image such that the covered region of the substrate is at least partially visible in the augmented probe system image.

A32. The method of paragraph A31, wherein the recording the reference substrate image is performed prior to the recording the base probe system image.

A33. The method of any of paragraphs A31-A32, wherein the combining the reference substrate image and the base probe system image includes combining such that the augmented probe system image illustrates the portion of the probe body that obscures the covered region of the substrate as being at least partially transparent.

A34. The method of paragraph A33, wherein the combining the reference substrate image and the base probe system image includes combining such that the augmented probe system image illustrates the portion of the probe body that obscures the covered region of the substrate as being at least substantially transparent and as being encompassed by an outline that represents a peripheral edge of the probe body.

A35. The method of paragraph A34, wherein the combining the reference substrate image and the base probe system image includes combining such that the augmented probe system image illustrates the probe solely as an outline of the probe body, optionally in combination with a/the virtual probe tip marker.

A36. The method of any of paragraphs A31-A35, wherein the method is performed at least substantially continuously such that the base probe system image includes a real-time probe image of a portion of the probe that is visible to the imaging device and a real-time substrate image of a portion of the substrate that is visible to the imaging device; and wherein the combining the reference substrate image and the base probe system image includes combining such that the augmented probe system image includes a reproduction and/or representation of at least a portion of the reference substrate image and one or both of:
  (i) a real-time probe representation that includes a reproduction and/or representation of at least a portion of the real-time probe image; and
  (ii) a real-time substrate representation that includes a reproduction and/or representation of at least a portion of the real-time substrate image.

A37. The method of paragraph A36, wherein the combining the reference substrate image and the base probe system image includes:
  reducing, optionally with the controller, an opacity of at least a portion of the real-time probe image such that the real-time probe representation illustrates the probe body as being at least partially transparent; and
  superimposing, optionally with the controller, the real-time probe representation on the reference substrate image.

A38. The method of any of paragraphs A36-A37, wherein the combining the reference substrate image and the base probe system image includes:
  reducing, optionally with the controller, an opacity of at least a portion of the reference substrate image; and
  superimposing, optionally with the controller, the reference substrate image on the real-time probe representation such that at least a portion of the real-time probe representation is at least partially visible.

A39. The method of paragraph A38, wherein the reducing the opacity of the real-time probe image includes reducing the opacity such that a peripheral edge region of the probe body is more opaque than a central region of the probe body that is encompassed by the peripheral edge region.

A40. The method of any of paragraphs A36-A39, wherein the combining the reference substrate image and the base probe system image includes:
  comparing, optionally with the controller, the real-time substrate image to the reference substrate image to determine a substrate image offset of the real-time substrate image relative to the reference substrate image; and
  shifting, optionally with the controller, the reference substrate image relative to the real-time probe representation by the substrate image offset such that a position of the reference substrate image relative to the real-time probe representation is nominally identical to a position of the real-time substrate image relative to the real-time probe image.

A41. The method of any of paragraphs A31-A40, wherein the combining the reference substrate image and the base probe system image includes combining such that the augmented probe system image includes a reproduction and/or representation of the reference substrate image within the covered region and outside of the covered region.

A42. The method of any of paragraphs A31-A41, wherein the combining the reference substrate image and the base probe system image includes combining such that the augmented probe system image includes a reproduction and/or representation of the reference substrate image within the covered region and includes a/the real-time substrate representation outside of the covered region.

A43. The method of any of paragraphs A31-A42, further comprising, prior to the generating the augmented probe system image, recording, with the imaging device, a reference probe image of a portion of the probe, optionally a portion of the probe that obscures the covered region of the substrate; and wherein the combining the reference substrate image and the base probe system image includes combining such that the augmented probe system image includes a reproduction and/or representation of at least a portion of the reference substrate image and a reference probe representation that includes a reproduction and/or representation of at least a portion of the reference probe image.

A44. The method of paragraph A43, wherein the reference probe representation is formed by reducing, optionally with the controller, an opacity of the reference probe image such that at least a portion of the probe body is at least partially transparent.

A45. The method of any of paragraphs A31-A44, wherein the combining the reference substrate image and the base probe system image includes combining such that the augmented probe system image includes a reproduction and/or representation of the reference probe representation and one or both of a reproduction and/or representation of a/the reference substrate image and a reproduction and/or representation of a/the real-time substrate representation.

B1. A probe system, comprising:
  a chuck with a chuck support surface configured to support a substrate that includes one or more devices under test (DUTs);
  a probe assembly with a probe configured to test a corresponding DUT of the one or more DUTs;
  an imaging device configured to receive an optical image of at least a portion of the probe system; and
  a controller programmed to perform the method of any of paragraphs A1-A45 to generate the augmented probe system image;
  wherein the probe system is the probe system of any of paragraphs A1-A45.

B2. The probe system of paragraph B1, further comprising the substrate.

B3. The probe system of any of paragraphs B1-B2, wherein the imaging device includes one or more of a microscope, a camera, a charge-coupled device, an imaging sensor, a solid-state imaging device, a C-MOS imaging device, and a lens.

B4. The probe system of any of paragraphs B1-B3, wherein, during operative use of the probe system, the imaging device faces the substrate and is positioned on the same side of the substrate as the probe.

B5. The probe system of any of paragraphs B1-B4, wherein, during operative use of the probe system, the imaging device is positioned such that the probe is proximal the substrate relative to the imaging device.

B6. The probe system of any of paragraphs B1-B5, wherein the imaging device is configured to receive the optical image along an optical axis, and wherein the imaging device is positioned such that the probe is between the imaging device and the chuck along the optical axis.

B7. The probe system of paragraph B6, wherein the optical axis is at least substantially perpendicular to the chuck support surface.

B8. The probe system of any of paragraphs B1-B7, wherein the imaging device is positioned such that the optical image is a top view image of the portion of the probe system.

B9. The probe system of any of paragraphs B1-B8, wherein the imaging device is at least partially operatively supported by the probe assembly.

B10. The probe system of any of paragraphs B1-B9, wherein at least a portion of a/the probe body is optically opaque.

B11. The probe system of paragraph B10, wherein at least a portion of a/the probe beam is optically opaque.

B12. The probe system of any of paragraphs B1-B11, wherein the at least one probe tip includes one probe tip, two probe tips, three probe tips, or more than three probe tips.

B13. The probe system of any of paragraphs B1-B12, further comprising a display configured to present the augmented probe system image.

B14. The probe system of any of paragraphs B1-B13, wherein the controller is programmed to generate an/the augmented probe system image signal and to transmit the augmented probe system image signal to the display.

B15. The probe system of any of paragraphs B1-B14, wherein the probe assembly further includes a/the probe manipulator that operatively supports the probe; and wherein the probe manipulator is configured to operatively translate and/or rotate the probe relative to the chuck.

B16. The probe system of paragraph B15, wherein the probe manipulator is configured to be controlled by the controller.

B17. The probe system of paragraph B16, wherein the controller is programmed to generate and transmit a/the probe manipulator control signal to the probe manipulator to command the probe manipulator to translate and/or rotate the probe relative to the chuck.

B18. The probe system of any of paragraphs B1-B17, further comprising a/the chuck translation stage with a chuck translation stage support surface that operatively supports the chuck; wherein the chuck translation stage is configured to operatively translate and/or rotate the chuck relative to the probe assembly.

B19. The probe system of paragraph B18, wherein the chuck translation stage is configured to be controlled by the controller.

B20. The probe system of paragraph B19, wherein the controller is programmed to generate and transmit a/the chuck translation stage control signal to the chuck translation stage to command the chuck translation stage to translate and/or rotate the chuck relative to the probe assembly.

C1. Non-transitory computer readable storage media including computer-executable instructions that, when executed, direct a probe system to perform the method of any of paragraphs A1-A45.

INDUSTRIAL APPLICABILITY

The probe systems disclosed herein are applicable to the semiconductor manufacturing and test industries.

It is believed that the disclosure set forth above encompasses multiple distinct inventions with independent utility. While each of these inventions has been disclosed in its preferred form, the specific embodiments thereof as disclosed and illustrated herein are not to be considered in a limiting sense as numerous variations are possible. The subject matter of the inventions includes all novel and non-obvious combinations and subcombinations of the various elements, features, functions and/or properties disclosed herein. Similarly, where the claims recite "a" or "a first" element or the equivalent thereof, such claims should be understood to include incorporation of one or more such elements, neither requiring nor excluding two or more such elements.

It is believed that the following claims particularly point out certain combinations and subcombinations that are directed to one of the disclosed inventions and are novel and non-obvious. Inventions embodied in other combinations and subcombinations of features, functions, elements, and/or properties may be claimed through amendment of the present claims or presentation of new claims in this or a related application. Such amended or new claims, whether they are directed to a different invention or directed to the same invention, whether different, broader, narrower, or equal in scope to the original claims, are also regarded as included within the subject matter of the inventions of the present disclosure.

The invention claimed is:

1. A method of producing an augmented probe system image representing a portion of a probe system, the method comprising:
    recording, with an imaging device, a base probe system image of at least a portion of the probe system;
    generating, with a controller and based, at least in part, on the base probe system image, the augmented probe system image; and
    presenting, with a display, the augmented probe system image;
    wherein the augmented probe system image includes a representation of at least a portion of the probe system that is obscured by another portion of the probe system in the base probe system image.

2. The method of claim 1, wherein the base probe system image includes one or both of:
    (i) an image of at least a portion of a substrate that includes one or more devices under test (DUTs); and
    (ii) an image of at least a portion of a probe of the probe system that is configured to test a corresponding DUT of the one or more DUTs.

3. The method of claim 2, wherein the recording the base probe system image includes recording such that the probe is positioned between the substrate and the imaging device.

4. The method of claim 1, wherein the probe system includes a probe that is configured to test a corresponding device under test (DUT) of one or more DUTs of a substrate; wherein the probe includes:
    a probe body; and
    a probe tip extending from the probe body and terminating in a probe tip end for contacting the corresponding DUT;
    wherein the recording the base probe system image includes recording such that at least the probe tip end of the probe tip is obscured by the probe body; and
    wherein the generating the augmented probe system image includes generating a virtual probe tip marker that is indicative of a location of the probe tip end.

5. The method of claim 4, wherein the generating the virtual probe tip marker includes determining a position of the probe tip end relative to the probe body; and wherein the generating the augmented probe system image includes modifying the base probe system image to include the virtual probe tip marker based, at least in part, on the determining the position of the probe tip end.

6. The method of claim 5, wherein the determining the position of the probe tip end includes:
   contacting the substrate with the probe tip end to physically mark the substrate with the probe tip at a tip contact location;
   translating the probe relative to the substrate by a probe displacement distance such that the tip contact location is visible to the imaging device; and
   imaging, with the imaging device, the tip contact location; and
   wherein the generating the virtual probe tip marker includes assigning a virtual probe tip location of the virtual probe tip marker relative to a probe body reference structure of the probe body based, at least in part, on the probe displacement distance and the imaging the tip contact location.

7. The method of claim 6, wherein the determining the position of the probe tip end further includes, subsequent to the contacting the substrate with the probe tip end and prior to the translating the probe relative to the substrate, disengaging the probe tip end from the substrate such that the probe tip end remains nominally aligned with the tip contact location.

8. The method of claim 6, wherein the assigning the virtual probe tip location includes assigning such that the virtual probe tip location is offset from the probe body reference structure by a virtual marker reference offset that is equal to an offset between the tip contact location, as determined via the imaging the tip contact location, and the location of the probe body reference structure during the contacting the substrate with the probe tip end.

9. The method of claim 6, wherein the imaging device is a single imaging device; and wherein the imaging the tip contact location and the recording the base probe system image are performed with the single imaging device.

10. The method of claim 6, wherein the presenting the augmented probe system image includes presenting the virtual probe tip marker at the virtual probe tip location.

11. The method of claim 6, wherein the determining the position of the probe tip end further includes one or both of:
   recording, with the imaging device, a first calibration image in which the probe tip is nominally positioned at the tip contact location; and
   subsequent to the translating the probe relative to the substrate, recording, with the imaging device, a second calibration image in which the tip contact location is visible; and
   wherein the assigning the virtual probe tip location is based, at least in part, on one or both of the first calibration image and the second calibration image.

12. The method of claim 11, wherein the determining the position of the probe tip end further includes measuring the probe displacement distance to be a distance between a location of the probe body reference structure as recorded in the first calibration image and a location of the probe body reference structure as recorded in the second calibration image.

13. The method of claim 4, wherein the probe includes a plurality of probe tips; wherein the probe tip is a first probe tip of the plurality of probe tips; and wherein the generating the augmented probe system image includes repeating the generating the virtual probe tip marker for each probe tip of the plurality of probe tips.

14. The method of claim 1, wherein the probe system includes a probe that is configured to test a corresponding device under test (DUT) of one or more DUTs of a substrate; wherein the probe includes:
   a probe body; and
   a probe tip extending from the probe body and terminating in a probe tip end for contacting the corresponding DUT;
   wherein the recording the base probe system image includes recording such that a covered region of the substrate is obscured by at least a portion of the probe body and is not visible to the imaging device; and
   wherein the generating the augmented probe system image includes generating such that the augmented probe system image includes a graphical representation of at least a portion of the covered region.

15. The method of claim 14, wherein the corresponding DUT includes one or more contact pads to be contacted by the probe tip of the probe; wherein the covered region of the substrate includes at least one of the one or more contact pads, and wherein the generating the augmented probe system image includes generating such that the augmented probe system image includes a graphical representation of at least a portion of the at least one contact pad in the covered region.

16. The method of claim 14, further comprising:
   recording, with the imaging device, a reference substrate image of a portion of the substrate that is at least substantially unobscured by the probe; and
   wherein the generating the augmented probe system image includes combining the reference substrate image and the base probe system image such that the covered region of the substrate is at least partially visible in the augmented probe system image.

17. The method of claim 16, wherein the combining the reference substrate image and the base probe system image includes one or both of:
   (i) combining such that the augmented probe system image illustrates the portion of the probe body that obscures the covered region of the substrate as being at least partially transparent; and
   (ii) combining such that the augmented probe system image illustrates the portion of the probe body that obscures the covered region of the substrate as being at least substantially transparent and as being encompassed by an outline that represents a peripheral edge of the probe body.

18. The method of claim 16, wherein the method is performed at least substantially continuously such that the base probe system image includes a real-time probe image of a portion of the probe that is visible to the imaging device and a real-time substrate image of a portion of the substrate that is visible to the imaging device; and wherein the combining the reference substrate image and the base probe system image includes combining such that the augmented probe system image includes a representation of at least a portion of the reference substrate image and one or both of:
   (i) a real-time probe representation that includes representation of at least a portion of the real-time probe image; and
   (ii) a real-time substrate representation that includes a representation of at least a portion of the real-time substrate image.

19. The method of claim 18, wherein the combining the reference substrate image and the base probe system image includes:
- reducing an opacity of at least a portion of the real-time probe image such that the real-time probe representation illustrates the probe body as being at least partially transparent; and
- superimposing the real-time probe representation on the reference substrate image.

20. The method of claim 18, wherein the combining the reference substrate image and the base probe system image includes:
- comparing the real-time substrate image to the reference substrate image to determine a substrate image offset of the real-time substrate image relative to the reference substrate image; and
- shifting the reference substrate image relative to the real-time probe representation by the substrate image offset such that a position of the reference substrate image relative to the real-time probe representation is nominally identical to a position of the real-time substrate image relative to the real-time probe image.

21. The method of claim 16, further comprising, prior to the generating the augmented probe system image, recording, with the imaging device, a reference probe image of a portion of the probe that obscures the covered region of the substrate; and wherein the combining the reference substrate image and the base probe system image includes combining such that the augmented probe system image includes a representation of at least a portion of the reference substrate image and a reference probe representation that includes a representation of at least a portion of the reference probe image.

22. A probe system, comprising:
- a chuck with a chuck support surface configured to support a substrate that includes one or more devices under test (DUTs);
- a probe assembly with a probe configured to test a corresponding DUT of the one or more DUTs;
- an imaging device configured to receive an optical image of at least a portion of the probe system; and
- a controller programmed to perform the method of claim 1 to generate the augmented probe system image.

* * * * *